(12) United States Patent
Frederixon et al.

(10) Patent No.: US 12,324,083 B2
(45) Date of Patent: Jun. 3, 2025

(54) MICROWAVE HEATING SYSTEM WITH SUPPRESSION TUNNEL AND RELATED FEATURES

(71) Applicant: A.L.M HOLDING COMPANY, Onalaska, WI (US)

(72) Inventors: Drew J. Frederixon, Rockland, WI (US); Jacob G. Hehir, Holmen, WI (US); Kenneth D. Jaeger, Cameron, WI (US); Michael R. Byrnes, Sarona, WI (US); Gerald H. Reinke, La Crosse, WI (US); Vernon R. Hegg, Plymouth, MN (US)

(73) Assignee: A.L.M. HOLDING COMPANY, Onalaska, WI (US)

( * ) Notice: Subject to any disclaimer, the term of this patent is extended or adjusted under 35 U.S.C. 154(b) by 798 days.

(21) Appl. No.: 17/623,737

(22) PCT Filed: Jul. 1, 2020

(86) PCT No.: PCT/US2020/040464
§ 371 (c)(1),
(2) Date: Dec. 29, 2021

(87) PCT Pub. No.: WO2021/003250
PCT Pub. Date: Jan. 7, 2021

(65) Prior Publication Data
US 2022/0256662 A1    Aug. 11, 2022

Related U.S. Application Data

(60) Provisional application No. 62/869,305, filed on Jul. 1, 2019.

(51) Int. Cl.
*H05B 6/76* (2006.01)
*A23B 2/00* (2025.01)
(Continued)

(52) U.S. Cl.
CPC ............... *H05B 6/76* (2013.01); *A23B 2/001* (2025.01); *A23B 2/97* (2025.01); *E01C 19/08* (2013.01);
(Continued)

(58) Field of Classification Search
CPC ........ H05B 6/76; H05B 6/6426; H05B 6/784; H05B 6/707; H05B 2206/044;
(Continued)

(56) References Cited

U.S. PATENT DOCUMENTS 3,239,643 A * 3/1966 Kluck ...................... H05B 6/76
219/699
3,575,525 A    4/1971 Fox et al.
(Continued)

FOREIGN PATENT DOCUMENTS

CA    2051445 A1    10/1990
CA    2660700 A1    2/2008
(Continued)

OTHER PUBLICATIONS

Office Action from counterpart China Application No. 202080611494, dated Mar. 28, 2024, 18 pp.
(Continued)

*Primary Examiner* — Robert G Bachner
(74) *Attorney, Agent, or Firm* — Kagan Binder, PLLC

(57) ABSTRACT

A system for processing material, including at least one microwave generator, at least one microwave guide operatively connecting the at least one microwave generator to at least a first conveyor unit, and the first conveyor unit provided in a first housing that comprises at least one opening configured to receive microwave energy via a first microwave guide. The first conveyor unit is configured to receive and process a quantity of material, which includes
(Continued)

heating the material to a first temperature by applying microwave energy to the material within the first housing.

20 Claims, 32 Drawing Sheets

(51) Int. Cl.
*A23B 2/97* (2025.01)
*E01C 19/08* (2006.01)
*E01C 19/10* (2006.01)
*E01C 19/20* (2006.01)
*H05B 6/64* (2006.01)
*H05B 6/70* (2006.01)
*H05B 6/78* (2006.01)
*H05K 9/00* (2006.01)

(52) U.S. Cl.
CPC ........... *E01C 19/20* (2013.01); *H05B 6/6426* (2013.01); *H05B 6/784* (2013.01); *H05K 9/0056* (2013.01); *H05K 9/009* (2013.01); *A23V 2002/00* (2013.01); *E01C 19/1004* (2013.01); *E01C 2019/208* (2013.01); *H05B 6/707* (2013.01); *H05B 2206/044* (2013.01); *H05B 2206/046* (2013.01)

(58) Field of Classification Search
CPC ..... H05B 2206/046; A23B 2/001; A23B 2/97; E01C 19/08; E01C 19/20; E01C 19/1004; E01C 2019/208; E01C 19/104; H05K 9/0056; H05K 9/009; A23V 2002/00
See application file for complete search history.

(56) References Cited

U.S. PATENT DOCUMENTS

| | | | |
|---|---|---|---|
| 3,665,141 A | 5/1972 | Schiffmann et al. |
| 3,774,003 A | 11/1973 | Kaufman |
| 3,856,275 A | 12/1974 | Dydzyk |
| 4,176,267 A | 11/1979 | Rueggeberg |
| 4,180,718 A | 12/1979 | Hanson |
| 4,246,462 A | 1/1981 | Meisel |
| 4,252,459 A | 2/1981 | Jeppson |
| 4,253,005 A | 2/1981 | Gordon et al. |
| 4,276,093 A | 6/1981 | Pickermann |
| 4,319,856 A | 3/1982 | Jeppson |
| 4,338,869 A | 7/1982 | Hoskinson |
| 4,395,025 A | 7/1983 | Watanabe et al. |
| 4,488,027 A | 12/1984 | Dudley et al. |
| 4,619,550 A | 10/1986 | Jeppson |
| 4,808,782 A | 2/1989 | Nakagawa et al. |
| 4,861,955 A | 8/1989 | Shen |
| 5,083,870 A | 1/1992 | Sindelar et al. |
| 5,092,706 A | 3/1992 | Bowen et al. |
| 5,120,217 A | 6/1992 | O'Brien et al. |
| 5,242,493 A | 9/1993 | Glynn et al. |
| 5,270,000 A | 12/1993 | Goldner et al. |
| 5,303,999 A * | 4/1994 | Nath ............. F26B 11/028 366/132 |
| 5,447,388 A | 9/1995 | Rouse |
| 5,810,471 A | 9/1998 | Nath et al. |
| 5,902,510 A | 5/1999 | Balbaa et al. |
| 6,186,700 B1 | 2/2001 | Omann |
| 6,207,462 B1 | 3/2001 | Barclay et al. |
| 6,349,658 B1 | 2/2002 | Tyer |
| 6,455,826 B1 | 9/2002 | Araya et al. |
| 6,618,957 B2 | 9/2003 | Novak et al. |
| 6,768,089 B2 | 7/2004 | Minobe et al. |
| 7,081,605 B2 | 7/2006 | Fritts et al. |
| 7,432,483 B2 | 10/2008 | Wilson |
| 7,758,235 B1 | 7/2010 | Collette |
| 7,927,465 B2 | 4/2011 | Novak |
| 7,931,806 B2 | 4/2011 | Logan et al. |
| 8,101,893 B2 | 1/2012 | Bogdan |
| 8,490,904 B2 | 7/2013 | Liubakka et al. |
| 8,585,788 B2 | 11/2013 | Drozd et al. |
| 8,586,898 B2 | 11/2013 | Novak |
| 9,314,231 B2 | 4/2016 | O'Neil et al. |
| 9,624,625 B2 | 4/2017 | Coe |
| 9,642,194 B2 | 5/2017 | Wilber et al. |
| 10,081,920 B2 | 9/2018 | Coe |
| 10,155,866 B2 | 12/2018 | Le et al. |
| 10,214,786 B2 | 2/2019 | Logan et al. |
| 10,239,331 B1 | 3/2019 | Gervais et al. |
| 10,294,616 B2 | 5/2019 | Crupi et al. |
| 11,198,977 B2 | 12/2021 | Eliot |
| 12,058,799 B2 | 8/2024 | Hegg |
| 12,144,093 B2 | 11/2024 | Hegg |
| 12,144,094 B2 | 11/2024 | Hegg |
| 2002/0046474 A1 | 4/2002 | Novak et al. |
| 2002/0191481 A1 | 12/2002 | Cox et al. |
| 2007/0122235 A1 | 5/2007 | Atsushi et al. |
| 2010/0020630 A1 | 1/2010 | Musil |
| 2011/0290788 A1 | 12/2011 | Klemarewski |
| 2012/0029252 A1 | 2/2012 | Lissianski et al. |
| 2013/0056987 A1 | 3/2013 | Novak |
| 2013/0336720 A1 | 12/2013 | Jack et al. |
| 2013/0343145 A1 | 12/2013 | Villalobos |
| 2014/0119829 A1 | 5/2014 | Eliot |
| 2014/0146632 A1 | 5/2014 | Eliot |
| 2014/0263779 A1 | 9/2014 | Svec et al. |
| 2015/0164108 A1 | 6/2015 | Logan et al. |
| 2015/0237684 A1 | 8/2015 | Huber |
| 2017/0182531 A1 | 6/2017 | Hurlin et al. |
| 2018/0017323 A1 | 1/2018 | Whitney et al. |
| 2018/0187385 A1 | 7/2018 | Reinke et al. |
| 2018/0343713 A1 | 11/2018 | Swiergon et al. |
| 2019/0017233 A1 | 1/2019 | Coe |
| 2019/0100886 A1 | 4/2019 | Eliot |
| 2019/0274195 A1 | 9/2019 | Magana |
| 2019/0320508 A1 | 10/2019 | Vickers et al. |
| 2019/0373926 A1 | 12/2019 | Druga et al. |
| 2021/0007190 A1 | 1/2021 | Hegg |
| 2022/0136183 A1 | 5/2022 | Eliot |
| 2023/0074184 A1 | 3/2023 | Frederixon et al. |
| 2023/0126550 A1 | 4/2023 | Frederixon et al. |
| 2023/0210145 A1 | 7/2023 | Frederixon et al. |
| 2023/0211040 A1 | 7/2023 | Frederixon et al. |
| 2023/0328853 A1 | 10/2023 | Hegg |
| 2023/0345593 A1 | 10/2023 | Hegg |
| 2024/0080950 A1 | 3/2024 | Frederixon et al. |

FOREIGN PATENT DOCUMENTS

| | | |
|---|---|---|
| CL | 2017000155 A1 | 7/2017 |
| CL | 202103591 A1 | 10/2022 |
| CL | 2023000379 A1 | 7/2023 |
| CN | 201172789 Y | 12/2008 |
| CN | 102658077 A | 9/2012 |
| CN | 102690699 A | 9/2012 |
| CN | 106309136 A | 1/2017 |
| CN | 206204738 U | 5/2017 |
| CN | 108547199 A | 9/2018 |
| CN | 107673927 B | 10/2018 |
| DE | 2627588 B2 | 12/1977 |
| DE | 3505570 C1 | 1/1991 |
| EP | 0529285 A1 | 7/1992 |
| EP | 1611788 A1 | 4/2006 |
| EP | 2689833 A2 | 1/2014 |
| EP | 2920533 B1 | 6/2018 |
| EP | 2318487 B1 | 5/2019 |
| FR | 2522798 A1 | 9/1983 |
| FR | 2755450 A1 | 5/1998 |
| JP | S45-014954 B | 5/1970 |
| JP | S50-154545 U | 12/1975 |
| JP | S52-97653 U | 7/1977 |
| JP | S61-158091 U | 9/1986 |
| JP | H06-000147 B | 1/1994 |
| JP | H07-505193 A | 6/1995 |
| JP | 2008518930 A | 6/2008 |
| KR | 2010-0133842 A | 12/2010 |
| KR | 101030187 B1 | 4/2011 |

(56) References Cited

FOREIGN PATENT DOCUMENTS

| | | |
|---|---|---|
| KR | 101089213 B1 | 12/2011 |
| KR | 101251102 B1 | 4/2013 |
| WO | 90/12602 A1 | 11/1990 |
| WO | 1993009647 A1 | 5/1993 |
| WO | 93/10952 A1 | 6/1993 |
| WO | 1996034241 A1 | 10/1996 |
| WO | 2006050122 A1 | 5/2006 |
| WO | 2006057563 A1 | 6/2006 |
| WO | 2011036773 A1 | 3/2011 |
| WO | 2013166489 A1 | 11/2013 |
| WO | 2013166490 A2 | 11/2013 |
| WO | 2016/003583 A1 | 1/2016 |
| WO | 2016/012334 A1 | 1/2016 |
| WO | 2017165664 A1 | 9/2017 |
| WO | 2018154094 A1 | 8/2018 |
| WO | 2020/106263 A1 | 5/2020 |
| WO | 2021003250 A2 | 1/2021 |
| WO | 2022/245348 A1 | 11/2022 |
| WO | 2022/250663 A1 | 12/2022 |
| WO | 2023/069159 A1 | 4/2023 |
| WO | 2023/133182 A1 | 7/2023 |
| WO | 2023/133186 A1 | 7/2023 |
| WO | 2023/249650 A2 | 12/2023 |

OTHER PUBLICATIONS

Substantive Report from counterpart Chilean Application No. 202103591, dated Apr. 10, 2024, 29 pp.
International Search Report for related PCT/US2021/034241, 6 pages, Feb. 10, 2022.
Invitation to Pay Additional Fees for related PCT/US2021/033145, 22 pages, Mar. 25, 2022.
Vorster, W., "The Effect of Microwave Radiation on Mineral Processing," Thesis for the degree of Doctor of Philosophy at the University of Birmingham, Jun. 2001, 256 pp.
Wang et al., "Impact of Thermal Pretreatment Temperatures on Woody Biomass Chemical Composition, Physical Properties, and Microstructure," Energies, vol. 11, No. 1, Dec. 2017, 20 pp.
Wisconsin Department of Natural Resources (WI DNR) Chapter NR 204—Domestic Sewage Sludge Management, May 2011, No. 665, May 2011, 13 pp.
Zafar, S., "Thermal Conversion of Biomass," BioEnergy Consult—Powering a Greener Future, Sep. 2021, 10 pp.
"Animal Feeding Operations-Uses of Manure," National Pollutant Discharge Elimination System (NPDES), United States Environmental Protection Agency (EPA), Jan. 2022, 12 pp.
"Animal Product Manual" from the USDA Animal and Plant Health Inspection Service, U.S. Department of Agriculture, Second Edition issued 2014, 730 pp. (Filed in 8 parts).
"Bedding Option for Dairy Cows," UMass Extension Crops, Dairy, Livestock, and Equine Program, CDLE Pub. 11-48, retrieved from https://ag.umass.edu/sites/ag.umass.edu/files/fact-sheets/pdf/BeddingOptionsforDairyCows(11-48 on Dec. 28, 2021, 2 pp.
"Conveyorized Modular Industrial Microwave Power Systems," from Thermex Thermatron, accessed from https://thermex-thermatron.com/industrial-microwave-systems, on Apr. 10, 2019, 1 pp.
"DM-6: Lesson 12 Physical Methods—Thermal Processing," Module 4. Microbiology of food preservation, from Food and Industrial Microbiology, Nov. 2012, retrieved from http://ecoursesonline.iasri.res.in/mod/page/view.php?id=5130 on Jan. 2021, 10 pp.
Environmental Regulations and Technology—Control of Pathogens and Vector Attraction in Sewage Sludge, United States Environmental Protection Agency (EPA) Section 503.32, Jul. 2003, 186 pp.
European Union Animal By-Products Regulations (Regulation 1069/2009), Oct. 2009, 62 pp.
"Food Additive Status List," United States Food and Drug Administration (FDA) Food Additive Status List, retrieved from https://www.fda.gov/food/food-additives-petitions/food-additive-status-list current as of Aug. 2021, retrieved Jan. 2022, 99 pp.
"Food additives," from the World Health Organization dated Jan. 31, 2018, retrieved from https://who.it/news-room/fact-sheets/detail/food-additives on Dec. 29, 2021, 4 pp.
"Good Practices for the Feed Industry, Implementing the Codex Alimentarius Code of Practice on Good Animal Feeding," FAO Animal Production and Health Manual, Food and Agriculture Organization of the United Nations and International Feed Industry Federation, 2010, 106 pp.
"Heating, ventilation, and air conditioning," Wikipedia, retrieved from https://en.wikipedia.org/wiki/Heating,_ventilation,_and_air_conditioning on Sep. 7, 2020, 17 pp.
"Industrial Microwaves Information-Industrial Microwave Systems Components," from Cellencor, Apr. 10, 2019, 1 pp.
"Seed Heat-Treatment: A Management Strategy for Controlling Bacterial Diseases," Sustainable Farming on the Urban Fringe, Jan. 2012, retrieved from https://sustainable-farming.rutgers.edu/seed-heat-treatment-manage-bacterial-diseases/ on Apr. 20, 2022, 4 pp.
"Mechanical Heat Treatment of Municipal Solid Waste," from Department for Environment Food and Rural Affairs (Defra), 2007, 32 pp.
"Thermal Pre-treatment of Biomass for Large-scale Applications, Summary and Conclusions form the IEA Bioenergy ExCo66 Workshop," IEA Bioenergy: ExCo: 2011:05, Oct. 2010, 24 pp.
Whitepaper entitled "Thermal Processing of Food," from Safefood 360°, Inc., 2014, 23 pp.
Aramideh, S., "Numerical simulation of biomass fast pyrolysis in fluidized bed and auger reactors," Thesis for degree of Master of Science at Iowa State University, Jan. 2014, 121 pp.
Baiano, A., "Recovery of Biomolecules from Food Wastes—A Review," Molecules, vol. 19, No. 9, Sep. 2014, 22 pp.
Code of Federal Regulations, Chapter 21, Part 112—Standards for the Growing, Harvesting, Packing, and Holding of Produce for Human Consumption, May 2022, 50 pp.
Code of Federal Regulations, Chapter 40, Part 503—Standards for the Use of Disposal of Sewage Sludge, May 2022, 47 pp.
Carlson et al., "Bedding Recovery From Manure: The Solution to Livestock Bedding," Feeco International, retrieved from https://feeco.com/bedding-recovery-from-manure-the-solution-to-livestock-bedding/ on Dec. 28, 2021, 5 pp.
Data Sheet entitled "80dB Stainless steel RFI shielding Aaronia X-Steel," from AARONIA AG, Rev. 1.6, dated Jun. 1, 2015, 3 pp.
Data Sheet entitled "Fireproof Shielding Fabric Aaronia Mesh," from Aaronia Ag, Rev. 1.1, dated Sep. 19, 2014, 3 pp.
Doran et al., "Chapter 7. Treatments to Promote Seed Germination," from Handbook on Seeds of Dry-Zone Acacias: A Guide for Collecting, Extracting, Cleaning, and Storing the Seed and for Treatment to Promote Germination of Dry-zone Acacias, 1983, retrieved from http://www.fao.org/3/q2190e/q2190e07.htm on Apr. 20, 2022, 11 pp.
Drygas et al., "The impact of heat treatment on the components of plant biomass as exemplified by Junniperus sabina dn Picea abies," Econtechmod: An International Quarterly Journal on Economics of Technology and Modelling Processes, vol. 5, No. 3, Jul. 2016, 10 pp.
European Directive 86/278/EEC of Jun. 12, 1986 on the protection of the environment, and in particular of the soil, when sewage sludge is used in agriculture, Document 31986L0278, 7 pp.
European Directive 91/271/EEC of May 21, 1991 concerning urban waste-water treatment, Document 31991L0271, 13 pp.
European Directive 2008/98/EC of the European Parliament and of the Council of Nov. 19, 2008 on waste and repealing certain Directives (Text with EEA relevance), Document 32008L0098, 28 pp.
Hassani et al., "The influence of microwave irradiation on rocks for microwave-assisted underground excavation," Journal of Rock Mechanics and Geotechnical Engineering, vol. 8, No. 1, Dec. 2015, 15 pp.
International Search Report and Written Opinion of International Application No. PCT/US2020/040464, mailed Jan. 26, 2021, 27 pp.
International Preliminary Report on Patentability for International Application No. PCT/US2020/040464, mailed Jan. 13, 2022, 18 pp.
John et al., "Understanding microwave induced sorting of porphyry copper ores," Minerals Engineering, vol. 84, Dec. 2015, 37 pp.

(56) References Cited

OTHER PUBLICATIONS

Kingman, S., "Recent developments in microwave processing of minerals," International Materials Reviews, vol. 51, No. 1, Feb. 2006, 12 pp.

Koleini et al., Chapter 4, "Microwave Heating Applications in Mineral Processing," The Development and Application of Microwave Heating, Edited by Wenbin Cao, Nov. 2012, 26 pp.

Kostas et al., "The application of microwave heating in bioenergy: A review on the microwave pre-treatment and upgrading technologies for biomass," Renewable and Sustainable Energy Reviews, vol. 77, Apr. 2017, 63 pp. (PAPER).

Kouhkannejad, M., "Post-thermal application of feed additives," from All About Feed, Aug. 17, 2020, retrieved from https://www.allaboutfeed.net/animal-feed/feed-processing/post-thermal-application-of-feed-additives/ on Apr. 20, 2022, 6 pp.

Kwong et al., "Combustion of Biomass in Fluidized Beds: A Review of Key Phenomena and Future Perspectives," Energy & Fuels, vol. 35, No. 20, Oct. 2021, 32 pp.

Leach et al., "Recycling manure as cow bedding: Potential benefits and risks for UK dairy farms," The Veterinary Journal, vol. 206, No. 2, Nov. 2015, 8 pp.

Li et al., "Effectiveness of microwave-assisted thermal treatment in the extraction of gold in cyanide tailings," Journal of Hazardous Materials, vol. 384, Oct. 2019, 3 pp. Abstract Only.

Masthoff et al., "A systematic review of the effect of thermal processing on the allergenicity of tree nuts," Allergy European Journal of Allergy and Clinical Immunology, vol. 68, No. 8, Aug. 2013, 11 pp.

Mcgrath, M., "Heat Treating Seeds for Disease Management," by Cornell University, retrieved from http://vegetablemdonline.ppath.cornell.edu/NewsArticles/Hot-Water-Seed-Trt_McGrath_2016-17f56dy.pdf on Apr. 20, 2022, 38 pp.

Ozkoc et al., "Chapter 20—Recent Developments in Microwave Heating," Emerging Technologies for Food Processing (Second Edition), Aug. 2014, 23 pp.

Reyes et al., "Heat-Assisted Batch Settling of Mineral Suspensions in Inclined Containers," Minerals, vol. 9, No. 4, Apr. 2019, 19 pp.

Satish, H., "Exploring Microwave Assisted Rock Breakage for Possible Space Mining Applications," Thesis for the degree of Master of Engineering, for McGill University, Jun. 2005, 128 pp.

Setyawan, E., "Torrefaction of Biomass: An Overview," BioEnergy Consult—Powering a Greener Future, Jan. 2022, 7 pp.

Smeenk et al., "Experience with Atmospheric Fluidized Bed Gasification of Switchgrass," BioEnergy '98 conference, Dec. 1998, 9 pp. found at https://www.osti.gov/servletspurl/334227.

Taqi et al., "Understanding microwave heating in biomass-solvent systems," Chemical Engineering Journal, vol. 393, Mar. 2020, 10 pp.

Teimoori et al., "Twenty years of experimental and numerical studies on microwave-assisted breakage of rocks and minerals—a review, " arXiv: Applied Physics, Nov. 2020, 43 pp.

Tumuluru et al., "Formulation, Pretreatment, and Densification Options to Improve Biomass Specifications for Co-Firing High Percentages with Coal," Industrial Biotechnology, vol. 8, No. 3, Jun. 2012, 20 pp.

United States Code, Title 33, Navigation and Navigable Waters, Chapter 26, Water Pollution Prevention and Control, 1972, 233 pp. (Filed in 10 parts).

Office Action from counterpart Australian Application No. 2020298486, dated Feb. 20, 2025, 5 pp.

Vorster et al., "The effect of microwave radiation upon the processing of Neves Corvo copper ore," International Journal of Mineral Processing, vol. 63, No. 1, Jun. 2001, pp. 29-44. (Abstract Only).

Communication pursuant to Article 94(3) EPC from counterpart European Application No. 20745386.1, dated Nov. 8, 2023, 4 pp.

Substantive Report from counterpart Chilean Application No. 202103591, dated Oct. 10, 2023, 34 pp.

Office Action from counterpart Canadian Application No. 3,145,256, dated Feb. 28, 2024, 4 pp.

Office Action from counterpart Israeli Application No. 289465, dated Dec. 20, 2023, 7 pp.

Substantive Examination Report from counterpart Saudi Arabia Application No. 521431280, dated Dec. 28, 2023, 7 pp.

Zhang et al., "Liquefaction of Biomass and Upgrading of Bio-Oil: A Review," Molecules, vol. 24, No. 12, Jun. 2019, 30 pp.

Office Action from counterpart China Application No. 2020800611494, dated Sep. 27, 2024, 11 pp.

Office Action from counterpart Israeli Application No. 289465, dated May 29, 2024, 5 pp.

Office Action from counterpart Mexican Application No. MX/a/2022/000043, dated Oct. 14, 2024, 3 pp.

Substantive Report from counterpart Chilean Application No. 202300379, dated Feb. 26, 2025, 29 pp.

Office Action from counterpart Canadian Application No. 3, 145,256, dated Dec. 23, 2024, 5 pp.

Office Action from counterpart China Application No. 2020800611494, dated Jan. 21, 2025, 17 pp.

U.S. Appl. No. 17/782,830, filed Jun. 6, 2022, naming inventors Drew J. Frederixon et al.

Jankovic et al., "The Effects of Microwave Radiation on Microbial Cultures," Hospital Pharmacology—International Multidisciplinary Journal, vol. 1, No. 2, Jan. 2014, pp. 102-108.

Office Action from counterpart Japanese Application No. 2021-577981, dated Jun. 11, 2024, 13 pp.

Communication pursuant to Article 94(3) EPC from counterpart European Application No. 20745386.1, dated Apr. 22, 2025, 5 pp.

* cited by examiner

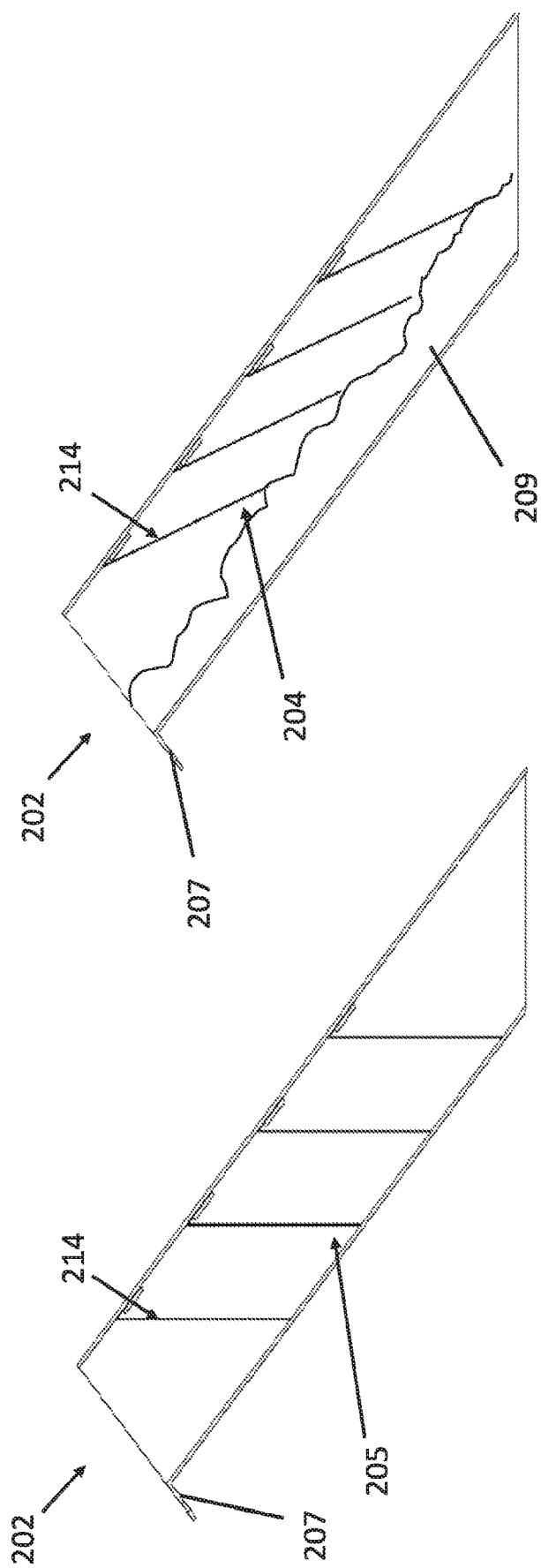

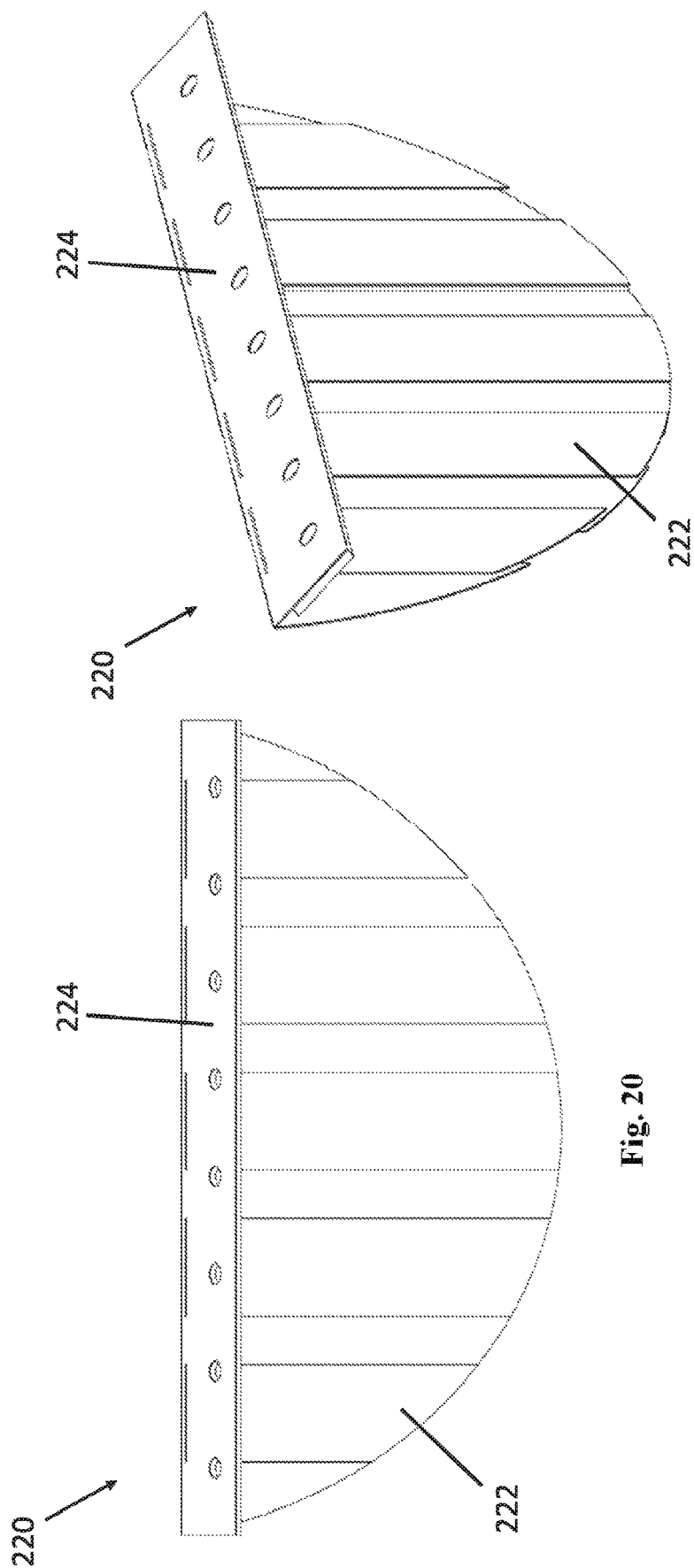

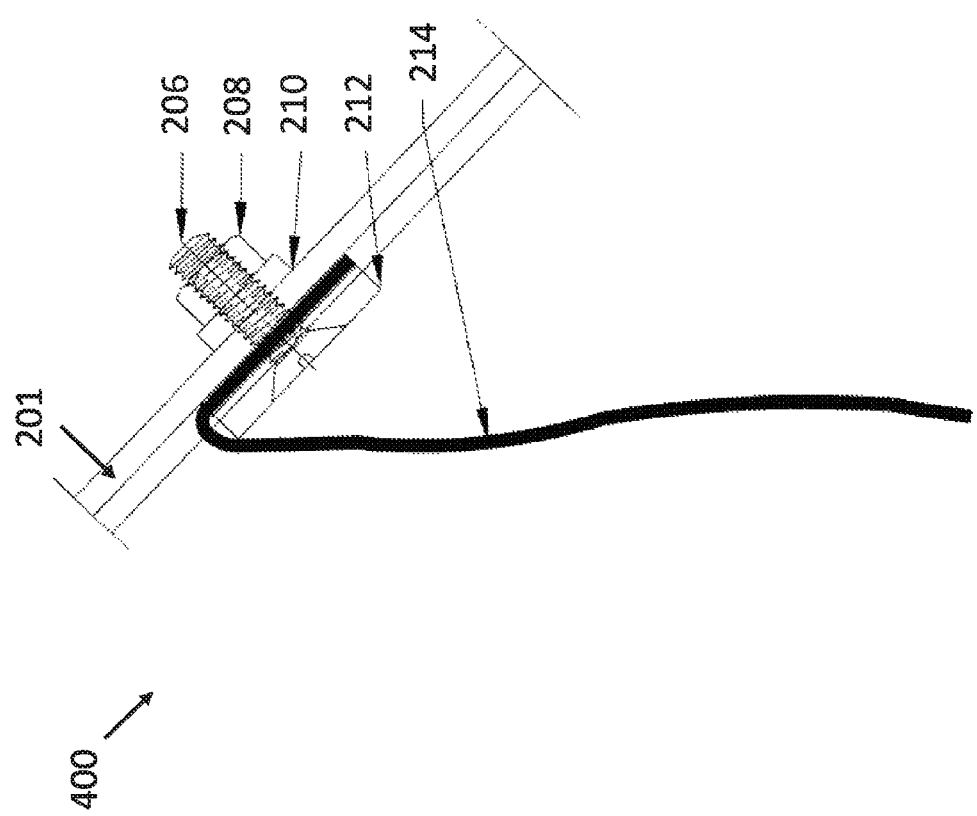

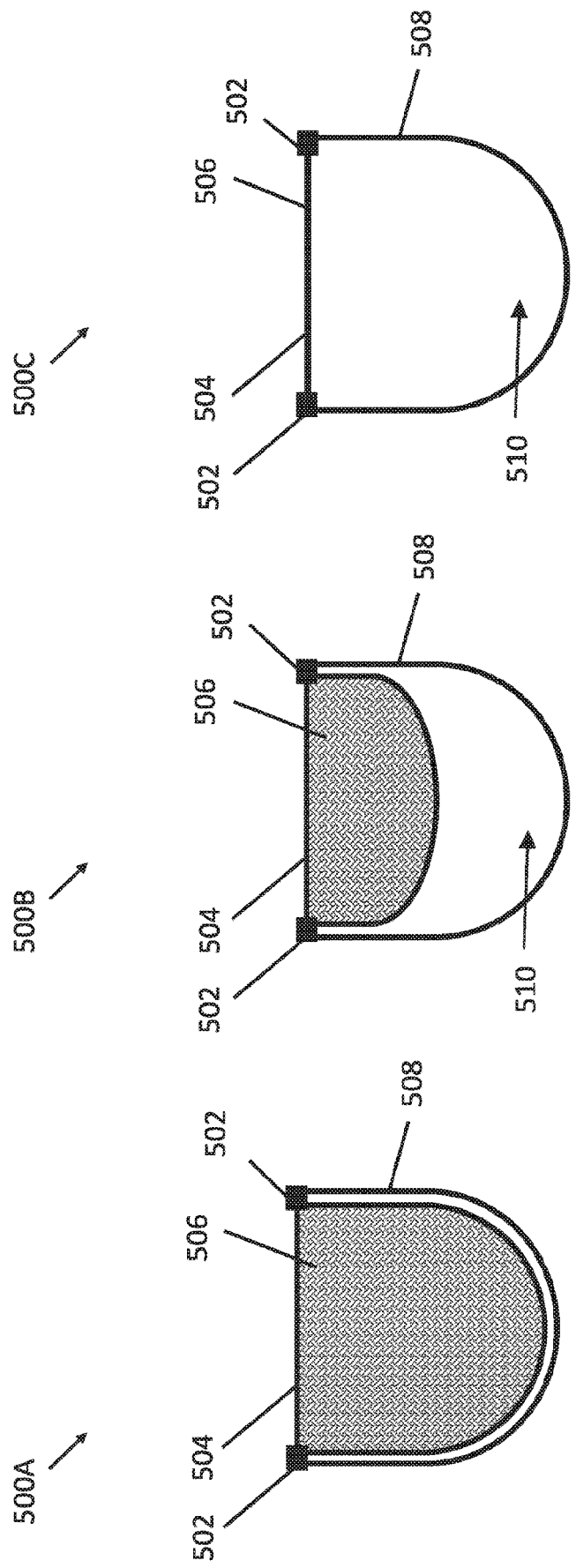

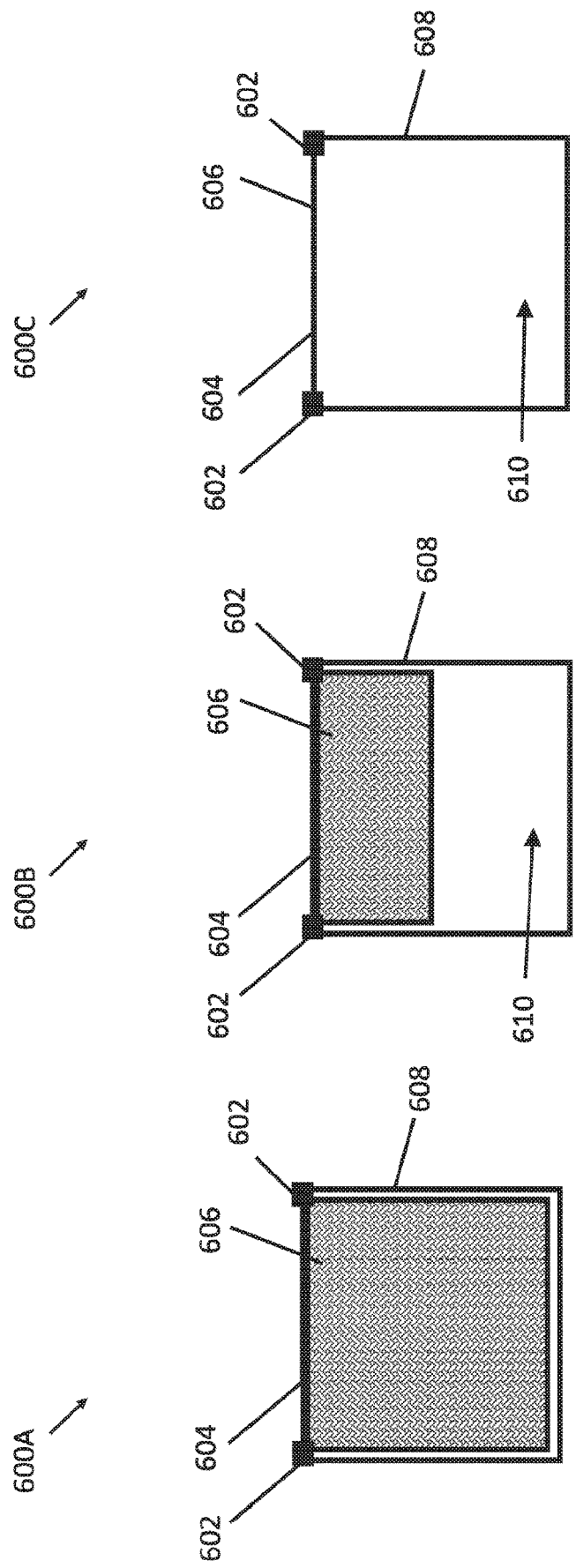

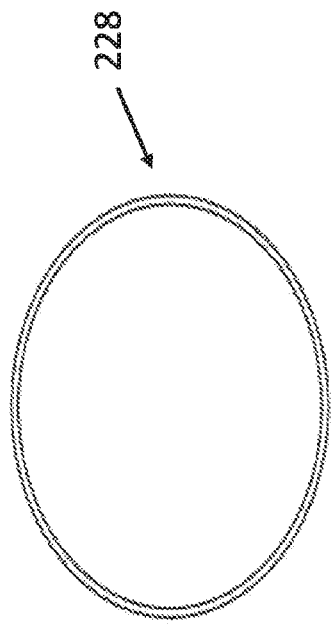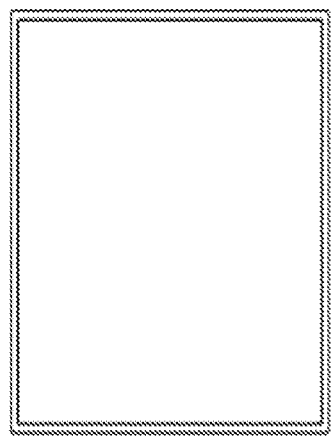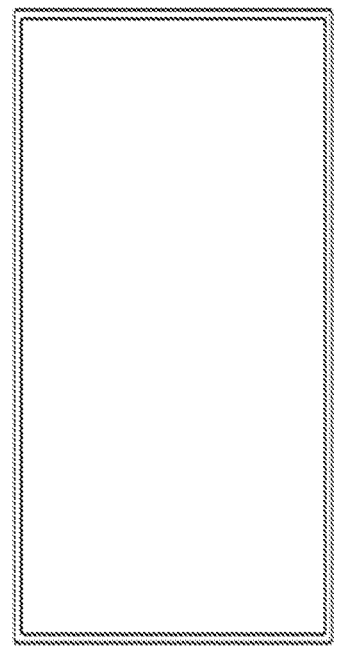
Fig. 31

MICROWAVE HEATING SYSTEM WITH SUPPRESSION TUNNEL AND RELATED FEATURES

CROSS-REFERENCE TO RELATED APPLICATIONS

This application claims priority to International Application No. PCT/US2020/040464, filed on Jul. 1, 2020, which in turn claims the benefit of U.S. Provisional Application with Ser. No. 62/869,305 titled "MICROWAVE SUPPRESSION TUNNEL AND RELATED FEATURES" filed Jul. 1, 2019, the entire contents of which are incorporated by reference in their entireties for all purposes herein.

BACKGROUND

Microwave energy can be radiated within an enclosure to process materials. Molecular agitation within the material resulting from its exposure to microwave energy provides energy to heat or dry the material. Heating the material using microwave energy can take a certain amount of time based on the quantity, chemical composition of material, moisture content, a desired final heating temperature, and other factors specific to the intended use of the material in its finally processed form.

There also exist challenges related to mobile deployment of heating systems, particularly in areas where a reliable permanent power source may not be present.

Some government agencies allocate frequency bands centered at 915 MHz and 2450 MHz for use in microwave heating systems. The intensity of the microwave energy that is permitted to leak is sometimes restricted to less than 10 milliwatts (mW) per centimeter squared.

Many industrial microwave heating applications require that there be access apertures into the enclosure so that materials may be continuously transported utilizing such as, for example, a conveyor unit or other mechanism. There is a desire for suppression of microwave energy from these apertures. Continuous microwave heating arrangements have presented a problem that is more complex than the suppression of microwave energy from a simpler batch microwave system.

While applying microwave heating to moisture-containing particles, a problem can include preventing microwaves from escaping to an inlet and/or an outlet/discharge region from a channel or region where the microwaves are applied. This can be handled at present by introducing material through a metal grate including two by two inch square metal channels. The same type of grate and channels can be employed on an outlet end. However, these grates have limitations. For example, granular materials or particles (such as moisture-laden granular materials) are sometimes introduced through a square channel system. In these systems, a blockage or slowdown in the process can occur.

Other technological approaches are currently used to prevent the danger of microwave emissions, but can be less flexible than desirable. For example, other ways of suppressing microwave energy from escaping from a microwave system as a product or material is moving through can include, for example, water jackets or reflectors.

There remains a desire to improve microwave suppression, especially in continuous microwave heating systems. There also remains a desire to provide modular and/or portable heating systems that can be flexibly deployed as needed.

SUMMARY

The present disclosure relates to a continuous heating system for manufacturing asphalt mix (in Europe, asphalt mix or finished asphalt mix are typically referred to as bituminous mix or finished bituminous mix; those skilled in the art readily understand this distinction). In particular, this disclosure relates to a continuous mix system for using a microwave heating process at the point of production.

According to the present disclosure, modular heating systems can be configured to sequentially arrange multiple conveyor units, mixer, and lifting units. Further arrangements provide at least partially parallel arrangements of multiple conveyor units, optionally in combination with sequential arrangements.

Also disclosed are embodiments of a microwave energy suppression tunnel with one or more flexible or bendable (e.g., steel) microwave reflecting components, such as mesh flaps, for substantially reducing or preventing the leakage of microwave energy from a microwave vessel, e.g., on a conveyor unit, while having a continuous flow of product or material through the vessel and suppression tunnels. The suppression tunnels can be installed on the inlet and the outlet side of the vessel and are sized to suppress leakage of the microwaves produced by the microwave system, whatever the size of the product.

Stated differently, embodiments of the invention include the addition of at least one microwave energy suppression tunnel configured for substantially preventing the leakage of microwave energy from one or more access openings in a microwave energized system while the product to be heated is flowing continuously through the microwave vessel, including, for example, a trough of a conveyor unit also fitted with a helical auger. The suppression tunnel can be used at inlets and/or outlets of the microwave energized system, and in some examples each suppression tunnel comprises a rectangular, U-shaped, or other suitably shaped tunnel about three feet or more in length installed flat or at an angle of preferably no more than about 45 degrees with multiple plies or layers of steel or other microwave material, such as metallic shielding mesh attached to the inner top of the rectangular or U-shaped tunnel or trough. The size of object/materials to be heated can be used as a guideline for adjusting tunnel or trough size for various embodiments. The tunnel and trough of the heating system can be sized and shaped differently in various embodiments.

Flexible or bendable mesh shielding (e.g., in the form of flaps) can be spaced at about six-inch intervals and be the same cross-sectional size as the tunnel in which they are mounted. The shielding mesh preferably operates to absorb, deflect, or block various frequency ranges, preferably from about 1 MHz to 50 GHz in radio frequency (RF) and low frequency (LF) electric fields.

According to a first aspect of the present disclosure, a microwave suppression system is disclosed. According to the first aspect, the microwave suppression system includes at least an inlet and an outlet. The microwave suppression system also includes a tunnel within at least one of the inlet and outlet that comprises at least one movable mesh flap within the tunnel. According to the first aspect, the at least one movable mesh flap is configured to absorb, deflect, or block microwave energy. Also according to the first aspect, the at least one movable mesh flap is configured by be deflected as a material passes through the tunnel and then returning to a resting, closed position when the material is no longer passing through the tunnel.

According to a second aspect of the present disclosure, an apparatus for treating material is disclosed. According to the second aspect, the apparatus for treating material includes a conveyor unit including a helical auger having an auger shaft provided along an auger rotational axis, the auger configured to rotate in a direction such that a quantity of material received at the conveyor unit is caused to be transported according the auger rotational axis. Also according to the second aspect, the apparatus includes at least one microwave energy generator, each microwave energy generator being operatively connected to a respective microwave guide configured to cause microwaves emitted by the microwave energy generator to heat the material within the conveyor unit by converting the microwaves to heat when absorbed by at least a portion of the quantity of material within the conveyor unit. Also according to the second embodiments, the quantity of material is heated using the microwave energy, and the quantity of material is caused to exit the conveyor unit after being heated to a target temperature.

According to a third aspect of the present disclosure, a method of making a bituminous mix is disclosed. According to the third aspect, the method includes receiving a quantity of recycled asphalt paving (RAP) at a conveyor unit comprising an auger, where the RAP passes through at an inlet microwave suppression tunnel before entering the conveyor unit. The method also includes transporting the quantity of RAP along the conveyor unit by causing the auger to rotate. The method also includes heating the quantity of RAP within the conveyor unit using at least one microwave generator operatively connected to a respective microwave guide configured to cause microwaves emitted by the microwave energy generator to heat the quantity of RAP within the conveyor unit by converting the microwaves to heat when absorbed by at least a portion of the quantity of RAP within the conveyor unit. The method also includes causing the heated quantity of RAP to exit the conveyor unit through an outlet microwave suppression tunnel, where the quantity of RAP that exits the conveyor unit is a bituminous mix.

According to a fourth aspect of the present disclosure, a system for processing material is disclosed. According to the fourth aspect, the system includes at least one microwave generator. The system also includes at least one microwave guide operatively connecting the at least one microwave generator to at least a first conveyor unit. According to the fourth aspect, the first conveyor unit provided in a first housing that comprises at least one opening configured to receive microwave energy via a first microwave guide. Also according to the fourth aspect, the first conveyor unit is configured to receive and process a quantity of material, which includes heating the material to a first temperature by applying microwave energy to the material within the first housing.

According to a fifth aspect of the present disclosure, a method of processing material is disclosed. According to the fifth aspect, the method includes receiving a quantity of material at a first conveyor unit provided in a first housing. The method also includes performing a first processing step to the quantity of material within the first conveyor unit using at least one microwave generator coupled to the housing of the first conveyor unit, where the material is heated within the first conveyor unit.

According to a sixth aspect of the present disclosure, a method for portably providing processed material upon demand is disclosed. According to the sixth aspect, the method includes receiving a request for a first quantity of processed aggregate at a first location. The method also includes determining that the first location has a first group of characteristics that include at least a distance from the first location to an external power source of a first power output. The method also includes deploying a portable system for processing material at the first location based on at least the first quantity of aggregate and the first group of characteristics, the portable system comprising at least one power generator configured to provide at least the first power output. Also according to the sixth aspect, the portable system includes at least one microwave generator operatively coupled to the power generator. Also according to the sixth aspect, the portable system includes at least one conveyor unit configured to receive and process a quantity of material. The method also includes applying microwave energy to the material within the conveyor unit of the portable system.

DESCRIPTION OF THE DRAWINGS

FIG. 18 is cross-sectional side view of the microwave suppression tunnel of FIG. 16, showing multiple flaps in a closed position.

FIG. 19 is cross-sectional side view of the microwave suppression tunnel of FIG. 16, showing multiple flaps in an open position as flowing material passes the flaps.

FIG. 20 is a front view of an alternative arrangement mesh strip flap for use in a microwave suppression tunnel.

FIG. 21 is a perspective view of the alternative arrangement mesh strip flap of FIG. 20.

FIG. 28 is a schematic side view of a hardware detail section of a non-looped microwave absorbing flap with a mesh attached to a microwave suppression tunnel.

FIG. 29A is a cross-sectional end view of a U-shaped microwave suppression tunnel configuration with a top-mounted pivoting mesh flap in a closed position.

FIG. 29B is a cross-sectional end view of the U-shaped microwave suppression tunnel configuration of FIG. 29A with the mesh flap in a partially open position.

FIG. 29C is a cross-sectional end view of the U-shaped microwave suppression tunnel configuration of FIG. 29A with the mesh flap in a fully open position.

FIG. 30A is a cross-sectional end view of a rectangular microwave suppression tunnel configuration with a top-mounted pivoting mesh flap in a closed position.

FIG. 30B is a cross-sectional end view of the rectangular microwave suppression tunnel configuration of FIG. 30A with the mesh flap in a partially open position.

FIG. 30C is a cross-sectional end view of the rectangular microwave suppression tunnel configuration of FIG. 30A with the mesh flap in a fully open position.

FIG. 31 shows various alternative chute cross-sectional shapes of a microwave suppression tunnel.

DETAILED DESCRIPTION

Figure 1:
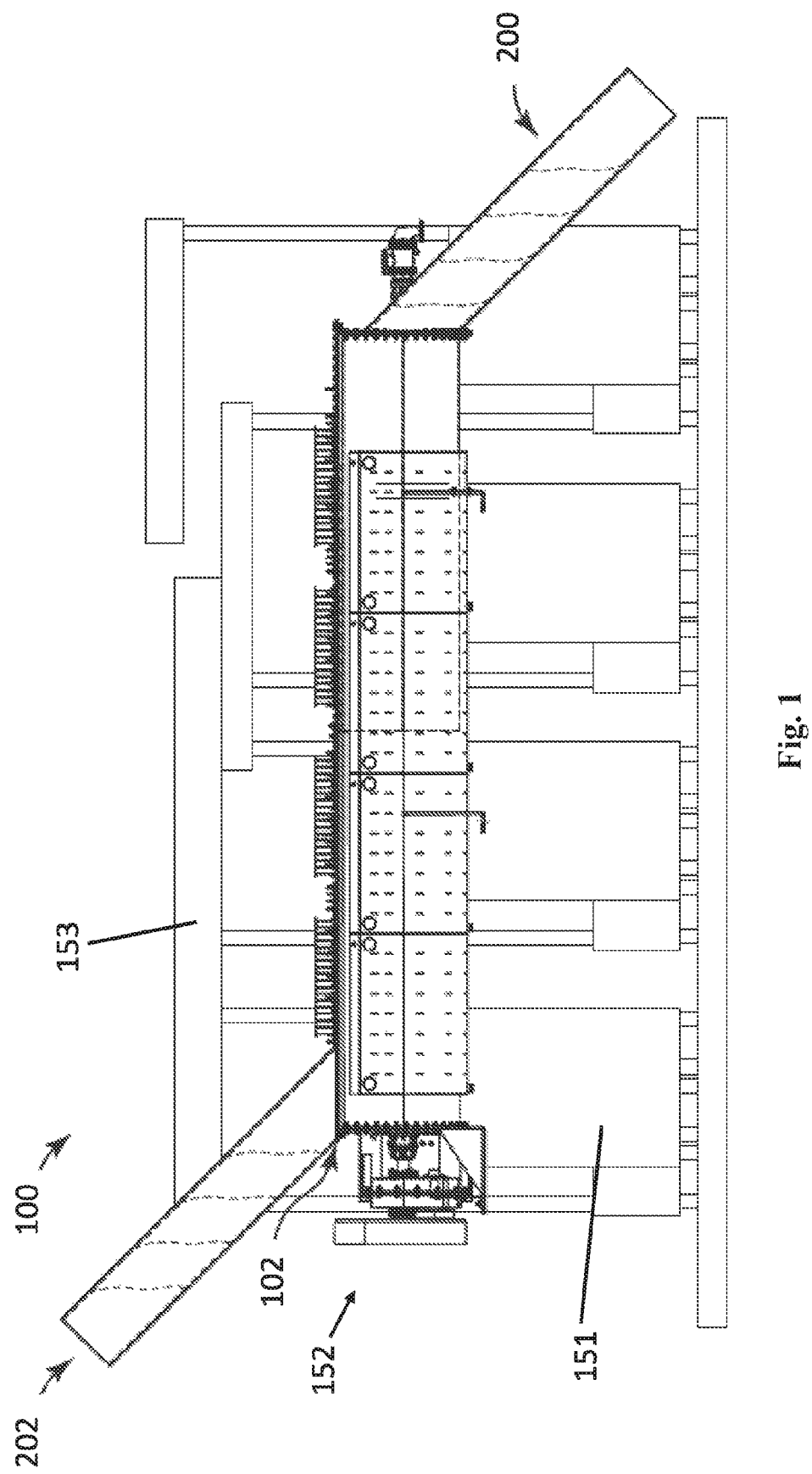
FIG. 1 is a side view of a portable, continuous mix system, according to various embodiments.
Figure 2:
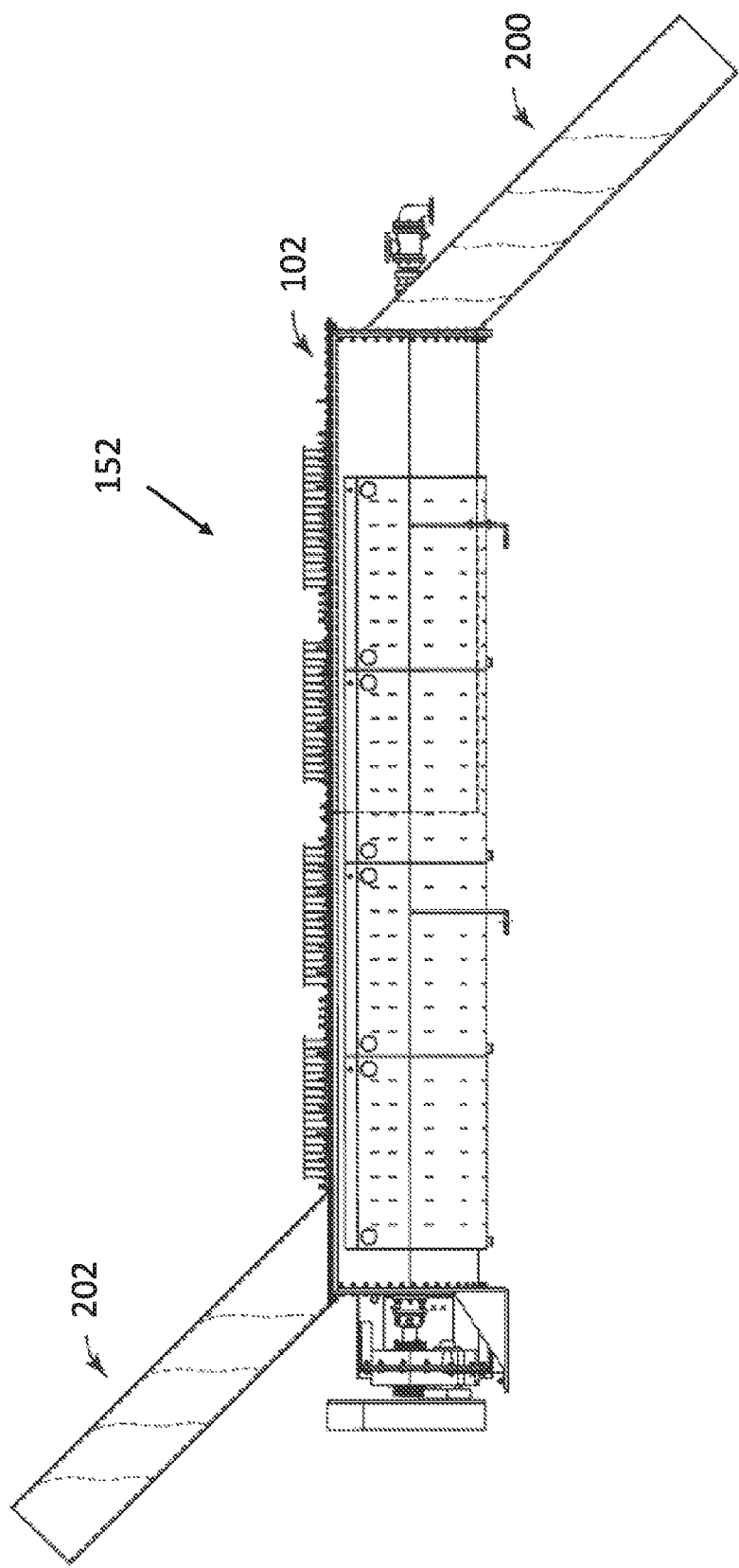
FIG. 2 is a side view of trough and suppression tunnel components of the continuous mix system of FIG. 1

According to the present disclosure, a problem currently exists in the art relating to heating a material to a desired temperature using microwave energy while continuously moving the material during heating. Certain existing configurations use a "batch" style heating and processing system. In batch systems, a quantity of material is heated and/or mixed together as a single stage and then is dispensed. It is often desirable to have more flexibility than a batch-style heating system affords because flexible operation of the heating and/or mixing system is preferred. Therefore, continuous type heating and/or mixing systems can be preferable because they can provide greater efficiency, control, and flexible scalability and operation, among other benefits.

Other challenges also exist in the art relating to microwave emissions escaping a heating system. At high material flow rates in a continuous production system, microwave energy leakage can be particularly undesirable and challenging.

Another common complication in the art relates to rapid distribution and deployment of heating apparatuses to remote or non-grid-connected regions or situations. Microwave-based heating is generally more portable than other types of heating apparatuses and allows for portable generator use to power the microwave heating units (e.g., microwave generators) and system if grid power is not readily accessible. Some examples of situations where grid power is not available include rural or remote areas, or other areas that have temporarily lost a grid power connection.

According to the present disclosure, portable, modular, parallel, and/or sequential heating and/or processing conveyor units can provide a modular, scalable, and portable system for heating a material even in remote, or otherwise off-grid locations. Various mixers and/or lifting conveyors can also be used in-line with the conveyor units as suitable. Packaging various operative components within or attached to containers or other housings, such as shipping containers, can further simplify and streamline rapid and simple distribution, setup, and operation.

Also according to the present disclosure, various microwave suppression systems and features, such as included in or related to inlet/outlet tunnels can be sized to accommodate the size of the flow of whatever product or material is being heated and/or processed, such as Reclaimed Asphalt Pavement (RAP) or Reclaimed Asphalt Shingles (RAS), virgin aggregate, or sand, all of which can be components of a bituminous mix. The material is also referred to herein as an aggregate material. In some cases, a microwave heating system of the present disclosure can be configured to process/heat about 100 tons of RAP per hour or more, although it would be obvious to one skilled in the art that the process could be scaled to accommodate quantities of less than 100 tons of material per hour.

One or more microwave suppression systems (e.g., tunnels or chutes) comprising one or more (e.g., flexible and/or movable) fabric and/or mesh flaps can be used at one or more openings within a microwave-based heating system in order to reduce microwave emissions that would otherwise reach the outside of the heating system. Each microwave suppression system can comprise a flap or series of flaps that are capable of and configured to cover one or more inlets and/or exits from a microwave heating system. The microwave suppression systems can prevent or suppress the escape of microwave emissions from the heating system. Therefore, one or more of the fabric and/or mesh flaps can be positioned at outlets and/or inlets of the continuous microwave heating system. Each flap can be generally shaped to conform to a shape of a corresponding suppression tunnel, chute, or the like. Outlets and/or inlets of the continuous microwave heating system can include one or more suppression tunnels. In particular, moisture-laden material, aggregate, RAP, RAS or other bituminous mix component particles or material can be allowed to enter into the heating region of microwave heating while microwaves are simultaneously substantially prevented from escaping a heating trough via the suppression tunnels within the system. As multiple modular heating and processing conveyors can be arranged sequentially and/or in parallel, various material inlets and outlets are particularly suitable for microwave suppression systems, including tunnels and other related features. In preferable embodiments, separate suppression systems such as tunnels are supplied and connected to both an inlet and an outlet of a system. In other embodiments, additional suppression tunnels or related features can be included intermediately to the system such that more than two such suppression systems are included in order to maximize microwave suppression from openings in the system.

It is known that microwave energy is particularly efficient for heating water (e.g., water molecules), which leads to efficient microwave heating of materials that include at least some of such water molecules. Water can escape a material in the gaseous form of steam when the water is heated to its boiling point (e.g., about 212 degrees Fahrenheit (° F.)). Steam can escape from a heating system through ventilation, and in some cases by forced ventilation, through positive or negative pressure applied to the system (e.g., a hot air blower or fan to expedite or assist ventilation). Vents can also be added to improve ventilation and facilitate steam escape characteristics. However, excessive quantities of water can have a negative effect on heating various RAP, RAS, and other materials. Furthermore, heat exchangers can be used to reclaim heat released as steam (or otherwise) during microwave heating processes, and in particular heat that is emitted from the phase change (e.g., boiling) of water when the material containing at least some water is heated.

In some typical cases, RAP can be about 3-8% water content, and in other cases emulsified asphalt, which may also include a softening agent, can be added to improve mixing efficiency. The addition of emulsified asphalt containing the softening agent (if used) can contribute additional water content. The emulsified asphalt and softening agent may be added at 0.5 to 5% by weight of the solid bituminous mix components being added to the microwave heating system. The emulsified asphalt and softening agent can contain water used to produce the emulsion and the water content can be typically between 20% and 80% with another, optional component being a blend of asphalt and softening agent. If, for example 2% of an emulsified asphalt and softening agent that contains 50% water is added to the solid bituminous mix components, then an additional 1% water would have been added to the material flowing through the heating system. Other amounts of emulsion will incorporate different amounts of water depending on the amount of emulsion added and amount of water present in the emulsion.

Heating a quantity of material or asphalt product (such as RAP) to a temperature above the boiling point of water (about 212° F.) can therefore be less efficient because the water particles boil off and escape as steam. During heating to certain temperatures, e.g., at or above a boiling point, the number of small dipole molecules (e.g., water) that the microwaves can easily heat through oscillation can decrease. Heating of the material or product then becomes reliant on the microwaves oscillation larger particles which may require more energy. More water is therefore removed from the heated asphalt product as heating temperature increases. A phase change of liquid water to gaseous steam can occur around 180-200° F., and it can be desirable to heat a material, e.g., an asphalt product, to about 225-275° F., according to various embodiments. Steam that is produced from the heating can escape the heating system via vents once the phase change occurs. According to various embodiments contemplated herein, steam and/or other heat produced and/or emitted during microwave heating can be captured for re-use using one or more air-air, and air-liquid heat exchangers or the like. The steam can exit the system by natural and/or forced ventilation. In some cases, there may be little or no bituminous emissions below about 250° F., or at a maximum below about 270-275° F.

According to various embodiments the material to be heated and/or processed is an aggregate material or other material. In certain embodiments the material can be various particles, such as particles to be heated. The material can be composed of various particulate materials. Examples of the aggregate material can comprise at least some recycled asphalt pavement (RAP), which can comprise various mixtures of the various particulate materials. The RAP can comprise between 1%-10% asphalt binder for a fractionated or non-fractionated RAP. Optionally, the RAP comprises aggregate and 2.5%-7.0% asphalt binder based on the use of a fractionated or non-fractionated RAP. In some embodiments the RAP is crushed RAP, milled RAP, or a blend of both.

In some embodiments, the material can comprise a bituminous mix, which can comprise virgin aggregate, virgin binder, and/or recycled or reclaimed bituminous materials such as RAP and/or RAS. The material in some embodiments can comprise other non-bituminous material additives to improve final bituminous mix properties. As used herein, "aggregate material" is intended to be used generally, and can refer to any material, particles, mixture, aggregate, or any other suitable material that can be heated using microwave energy as described herein. Aggregate material can be any flowable material in various embodiments.

In some embodiments, the aggregate material comprises at least some virgin aggregate material and/or virgin bitumen. In some embodiments, at least some binder material is added to the aggregate material, e.g., within the system. In further embodiments, the aggregate material comprises at least some additive, such as a recycling additive. The additive can be selected from the group consisting of: a recycling additive, a compaction aid additive, softening additive, anti-strip, and a cold-weather aid additive. In further embodiments, at least a quantity of virgin aggregate material is added to the aggregate material within the system. In yet further embodiments, the aggregate material comprises at least one of RAS and RAP. In some embodiments, at least one of the group consisting of: virgin aggregate, virgin binder, softening additive, and age retarding additives is added to a quantity of RAP before being caused to exit a conveyor unit. In some examples, the age retarding additive comprises blends of pure phytosterols or blends of pure phytosterols and crude sterols, where the crude sterols are derived from tall oil pitch of distillation residue of plant derived oils including soybean oil, corn oil, sunflower seed oil, rape seed oil or similar plant derived oils.

The aggregate material, e.g., when composed of RAP, can have an initial, first maximum particle size. The initial, first particle size can be reduced to a second, smaller maximum particle size by a component or feature of at least one of the first and second conveyor units, such as a baffle as described herein, or any other suitable component for reducing particle size as known in the art, such as an impactor or the like. If present, the impactor can be separate from the first and second conveyor units.

According to various embodiments, and as discussed above, the aggregate material contains at least some water. Optionally, the aggregate material contains less than ten percent water by weight. In various further examples, the aggregate material contains at least ten percent water by weight. In yet further examples, the aggregate material contains less than six percent water by weight. In yet further examples, the aggregate material contains between two and four percent water by weight. In even yet further examples, the aggregate material contains less than two percent water by weight. As discussed herein, in at least some embodiments, one heat exchanger apparatus configured to recover a heat byproduct from the aggregate material. In some examples the heat byproduct is recovered from the heating of the water within the aggregate material.

In some embodiments, one or more additives can be added to asphalt products to be heated and at various stages during processing. Various additives can provide a number of different qualities when added to material being processed. For example, additives can increase microwave energy absorption and efficiency during heating. Other additives can provide softening. Some examples of additives include sterol, bitumen, bio-derived products, petroleum-derived products, softening oils, and/or rejuvenating compositions. One illustrative example of an additive that can be added to various asphalt products include taconite tailings, and/or minerals that have magnetic qualities such as graphite, magnetite, and hematite, which can have a higher affinity for microwaves yet do not substantially result in the dissipation of heat as the vaporization of water would.

In some embodiments, a continuous microwave heating process can include dwell time, ramp-up time, hold time, and various heating peaks. Mixing of bituminous products of differing physical properties and utilizing non-bituminous additives can improve performance during microwave heating, according to some embodiments.

A conventional continuous microwave heating system sized in order to get a maximum throughput is limited to the physical size of the product being heated and weight per time (e.g., pounds per hour) of said product. This can be due to limitations, such as with existing heating, mixing, and tunnel design. An example (e.g., steel) mesh or fabric flap design of a microwave outlet suppression tunnel 200 as shown in FIG. 1 (and as explained in greater detail below) is better suited for high-volume continuous flow of various sized products. Microwave outlet suppression tunnel 200 is an example of a microwave suppression system as used herein. Also as shown in FIG. 1, multiple flaps can be used in a single microwave outlet suppression tunnel 200, e.g., four positioned sequentially as shown. Each flap is preferably shaped to conform to a shape of a corresponding outlet suppression tunnel 200, chute, or the like.

Drying, heating, and/or mixing of materials such as bituminous mix or asphalt materials is contemplated herein. However, any one type of suitable material can be heated, such as any other product that can be heated, and conveyed or flowed through a microwave heating system. For example, sugar beets, wood pulp, potatoes, corn, oats, other grains, shredded or chipped used tires or any other particulate materials can be heated and thereby dried. Food products, plant-derived products, animal-derived products, sand, and the like can also be heated and dried. Additionally, sanitization, pasteurization, etc. of various materials or products is also contemplated. Yet additional usages of the present disclosure relates to the mining industry, such as using microwaves to fracture rock/mineral, etc. Other applications of the microwave heating include ceramics, catalysts, vulcanizing, composites, bulk fibrous components, sand cores, general drying and heating of electrically non-conductive materials, and research and development.

Various embodiments of heating and/or processing systems discussed herein can have various total weight, and/or throughput capacities, depending on dimensions, power capacity, arrangements, and the like. In some embodiments, a continuous material processing system discussed herein has a capacity of about 10-1000 U.S. tons of aggregate material per hour. In further embodiments, the capacity can be between 50-100 U.S. tons of aggregate material per hour.

FIGS. 1-9 illustrate an embodiment of a portable, continuous (e.g., asphalt) mix system 100 having a housing, vessel, or trough 102 (or alternative trough 104) comprising a microwave heated apparatus with one or more microwave heating units 151 each with at least a corresponding waveguide 153 to define a guide path for microwaves. The continuous mix system 100 also preferably includes at least an outlet suppression tunnel 200, as shown. As shown, the continuous mix system 100 also includes a housing including a trough 102 including one or more microwave heating units 151, a conveyor system such as auger 106, an inlet suppression tunnel 202, and the outlet suppression tunnel 200. These components are described in greater detail herein.

According to FIGS. 1-9 a single conveyor unit continuous heating and/or processing system 100 is shown, although in various embodiments herein it is also shown that multiple conveyor units can be assembled sequentially, in parallel, or both in order to achieve a desired heating capacity and throughput for a given conveyor unit size. For example, running two conveyor units in parallel can offer twice the heating capacity and/or throughput of processed material compared to a single conveyor unit, provided suitable microwave heating units are provided.

Figure 4:
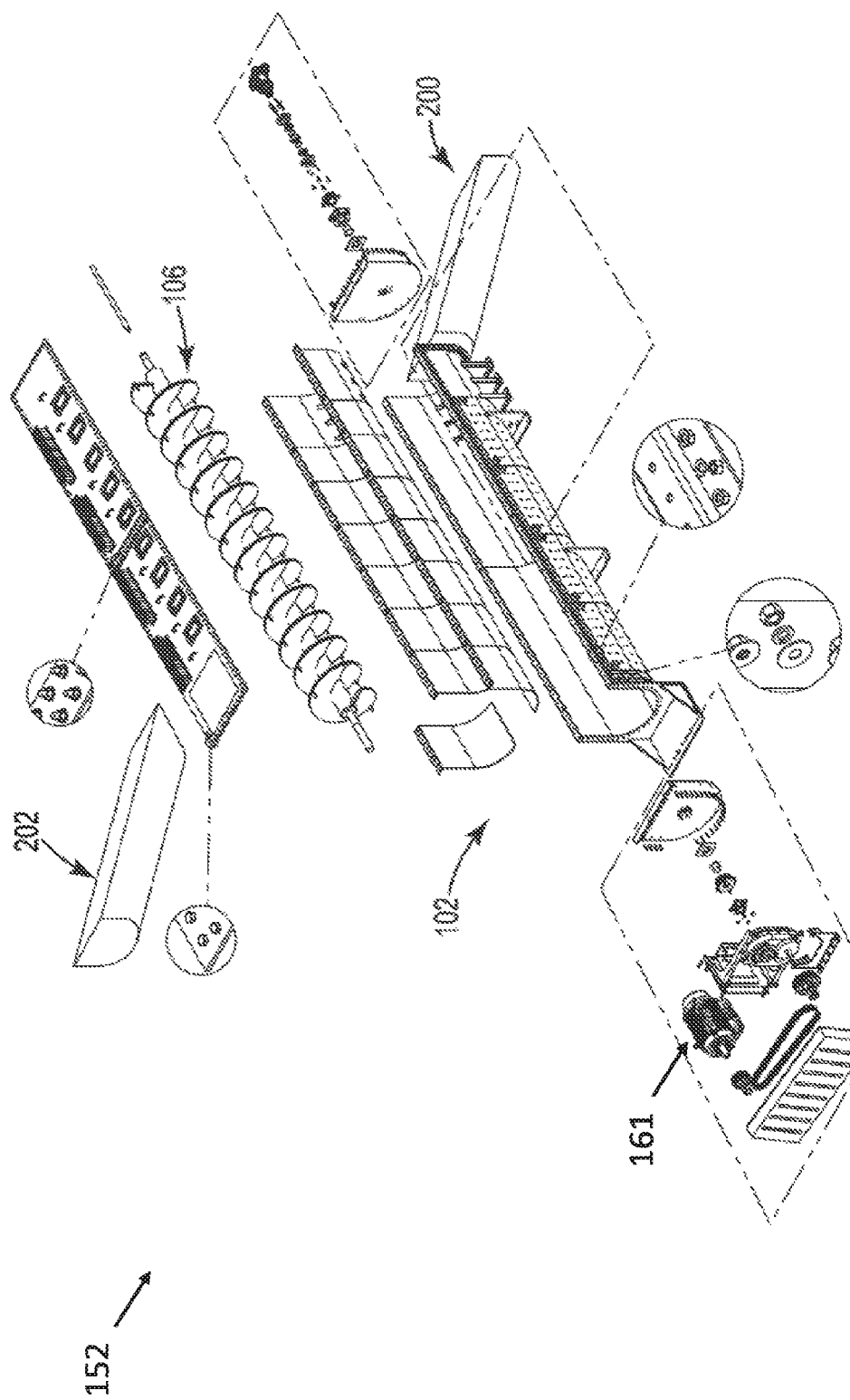
FIG. 4 is a perspective exploded view of the trough of the continuous mix system of FIG. 1.
Figure 6:
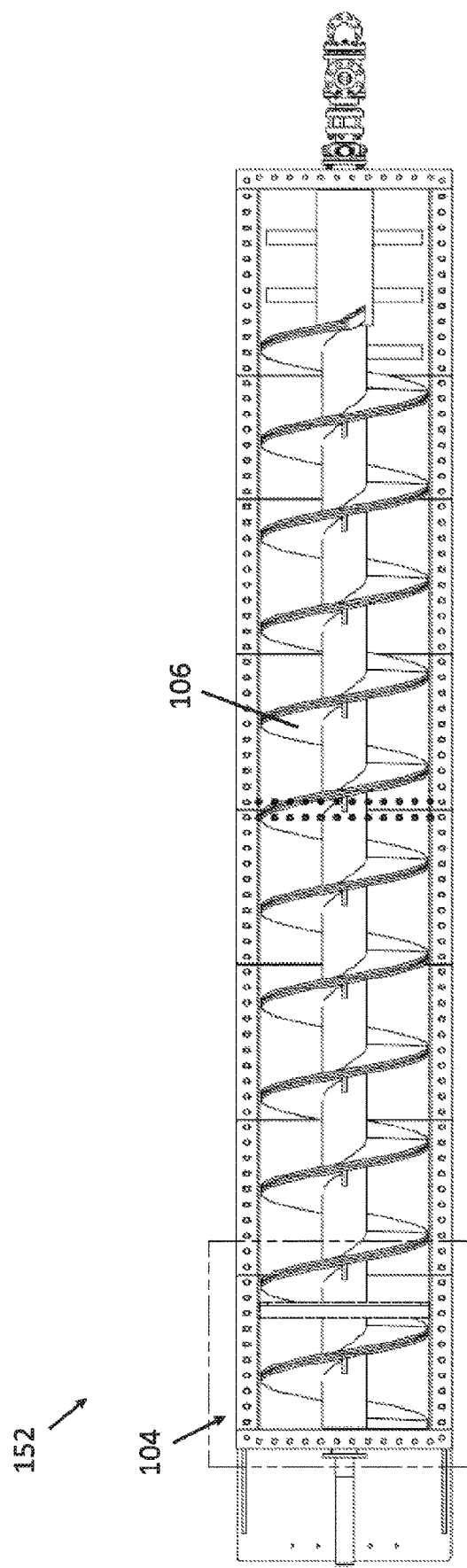
FIG. 6 is a top view of an auger for use with the trough of the continuous mix system of FIG. 1.
Figure 8:
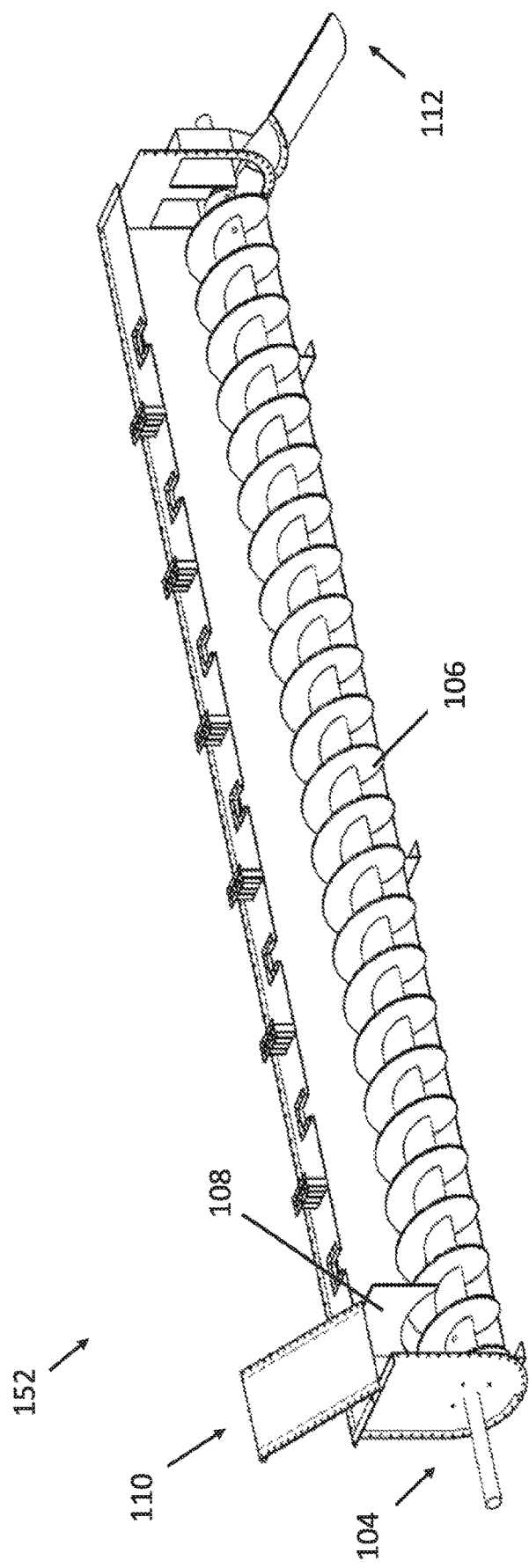
FIG. 8 is a partial cut-away view of the alternative trough of FIG. 7.

Shown best in FIGS. 4, 6, and 8, a helical auger 106 or (e.g., a helical screw) is one option for a conveyance mechanism by which material particles can be caused to pass through the housing trough 102 longitudinally. The auger 106 can be completely or partially covered in particles to be heated during operation, but the particles are not shown for clarity. The auger 106 can be a heated auger, and in some example can be a jacketed auger. The outlet suppression tunnel 200 can be connected to an outlet and/or inlet of trough 102. The trough 102 can be level or can be canted at an angle to the horizontal plane according to various embodiments. An angled trough 102 (and/or auger 106 in some embodiments) can facilitate movement of the material during processing by utilizing gravity assistance to flow downhill. An example trough 102 can be about twelve feet long and five feet wide, although any suitable size and/or shape is also contemplated.

FIGS. 2-9 show various components of the trough 102, auger 106, inlet suppression tunnel 202, outlet suppression tunnel 200, and other components of the system 100 in greater detail. Selected embodiments and variations of the inlet suppression tunnel 202 and the outlet suppression tunnel 200 and components thereof are shown in yet greater detail with respect to FIGS. 16-31. Furthermore, various embodiments of multiple-conveyor systems are shown with reference to FIGS. 10-15.

Figure 3:
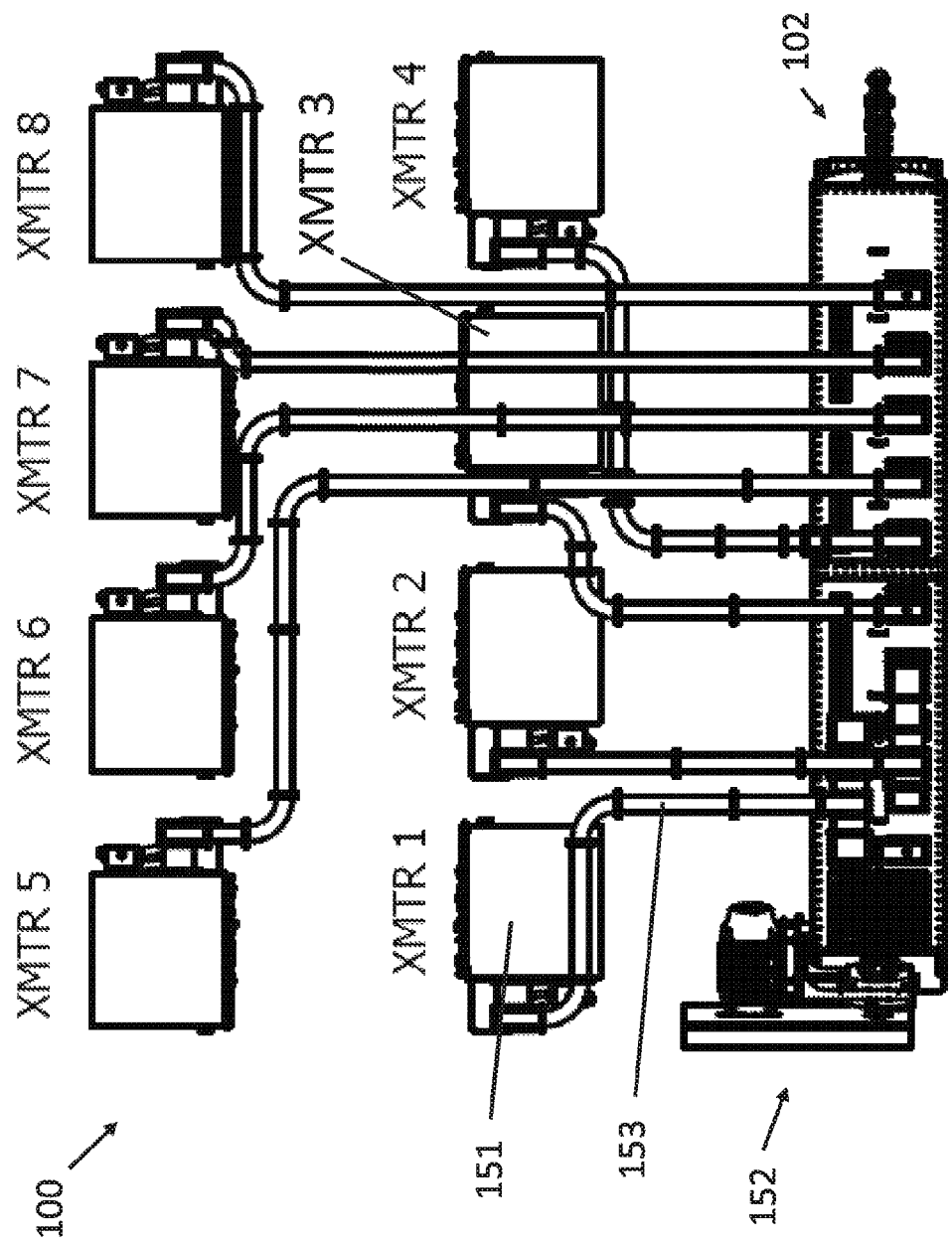
FIG. 3 is a top view of the continuous mix system of FIG. 1.

FIG. 3 shows a general configuration of a single-conveyor unit 152, continuous heating system 100 of the present description, including eight microwave heating units 151, a microwave waveguide 153 for each heating unit 151, an auger-based continuous heating assembly with trough 102, and various other components. In particular, FIG. 3 shows an example including eight microwave heating units 151 labeled as XMTR 1, XMTR 2, XMTR 3, XMTR 4, XMTR 5, XMTR 6, XMTR 7, and XMTR 8. More or fewer microwave heating units 151 (and corresponding waveguides 153) can be used in alternative embodiments. A number of waveguides 153 and therefore microwave generators 151 used with a trough 102 can be limited by a surface area of a top of the trough 102, including any vents, inlets, and/or outlets included thereon. In some examples 1-30 waveguides 153 can be utilized for each conveyor unit, and in more specific embodiments 7-10 waveguides can be utilized for each conveyor unit.

One example microwave heating unit 151 can be a microwave power system sourced from Thermax Thermatron. The microwave heating units 151 can have a variety of shapes and sizes according to the requirements of the continuous heating process and system 100. Each microwave heating unit can apply about 100 kW of power to the product being heated and preferably operates at about 915 MHz.

In various examples, various quantities of microwave energy can be received by the aggregate material while in a conveyor unit. For example, about 0.33 kW to 0.44 kW of microwave energy can be transmitted and received per pound unit weight, including any moisture present within the aggregate material. Alternatively, less than 0.33 kW or greater than 0.44 kW per pound weight is also contemplated.

Various conveyor units described herein (e.g., conveyor unit 152) can have a nominal weight capacity of about 500-40,000 lbs. In some examples, the conveyor units can each have a weight capacity of about 8,500 lbs of material at a point in time.

Various example waveguide 153 configurations and embodiments for a single conveyor unit 152 are shown in FIGS. 1 and 3. The various waveguides 153 can be configured to bend and be routed such that no two waveguides 153 collide, and in some cases the waveguides can be configured to minimize turns or bends in the waveguides, as practical. Similar waveguide 153 configurations can be adapted for use with multiple-conveyor unit systems described below. Each microwave heating unit 151 can optionally be connected to more than one waveguide 153.

Still referring to FIG. 1, a side view of the continuous heating assembly is shown, including an example inlet suppression tunnel 202, outlet suppression tunnel 200, and trough 102 of system 100. Although not shown, the trough 102 can be generally mounted or positioned, or provided with a shape generally comprising an angle relative to horizontal to facilitate asphalt movement or production during heating and/or conveying material for processing described herein, e.g., by at least partially utilizing gravity to move the asphalt of other material through the trough 102.

FIG. 4 is an exploded view of system 100. Shown is a conveyor motor 161 for rotating the auger 106, the housing trough 102 for holding and carrying the material (e.g., aggregate material, asphalt, etc.) to be heated, the inlet suppression tunnel 202, the outlet suppression tunnel 200, and various other components. The conveyor motor 161 can be an electric motor or other type of motor, and can utilize alternating current (AC) or direct current (DC) power of any voltage or power as suitable. In particular, FIG. 4 provides a more detailed view of system 100, including the trough 102, auger 106, inlet suppression tunnel 202, outlet suppression tunnel 200, and related components.

Figure 5:
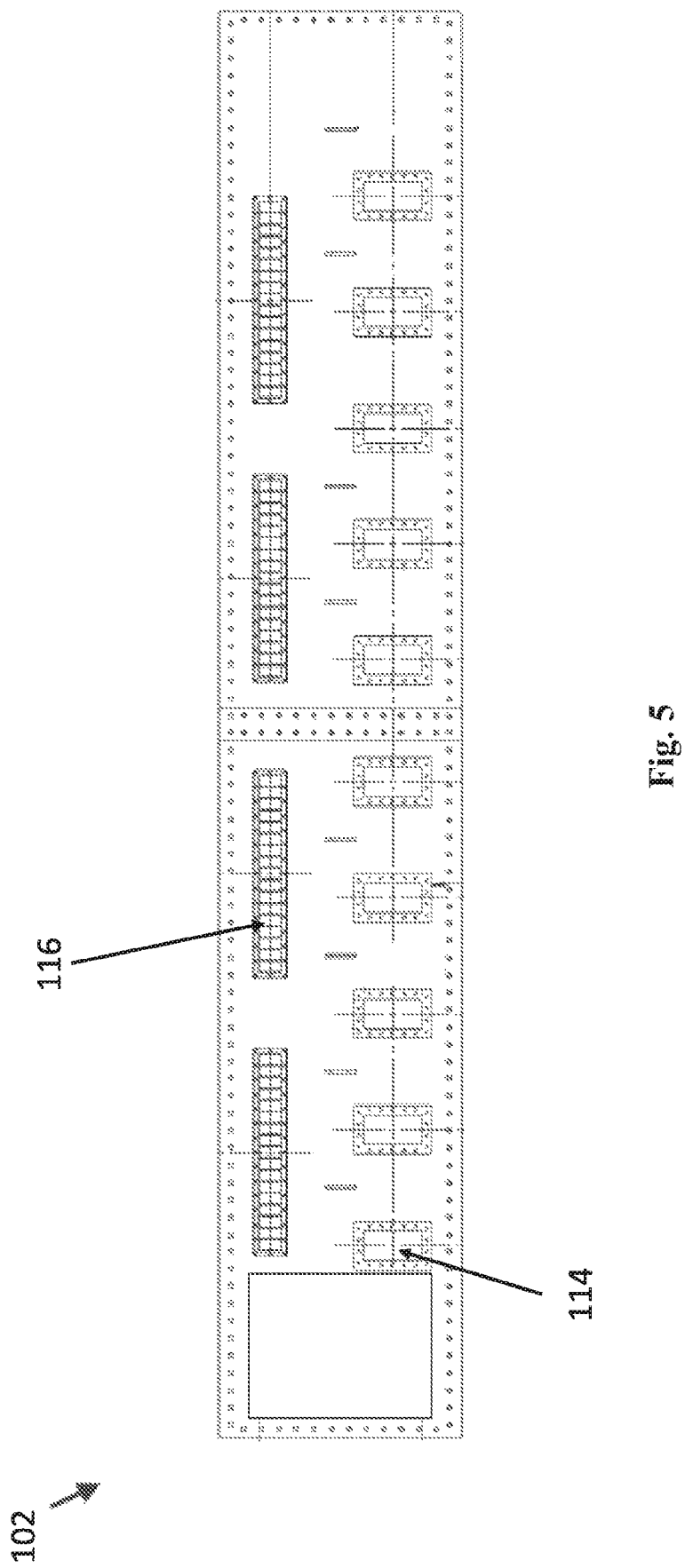
FIG. 5 is a top view of the trough of the continuous mix system of FIG. 1.
Figure 7:
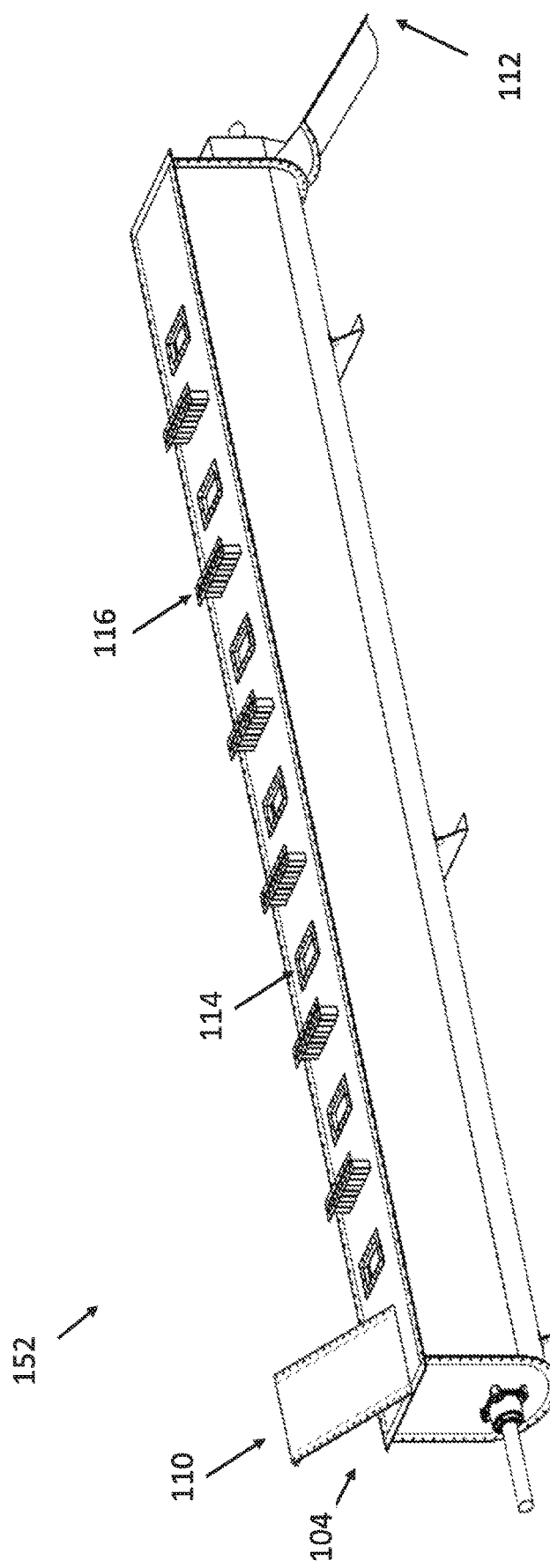
FIG. 7 is a perspective view of an alternative trough for use with the continuous mix system of FIG. 1
Figure 9:
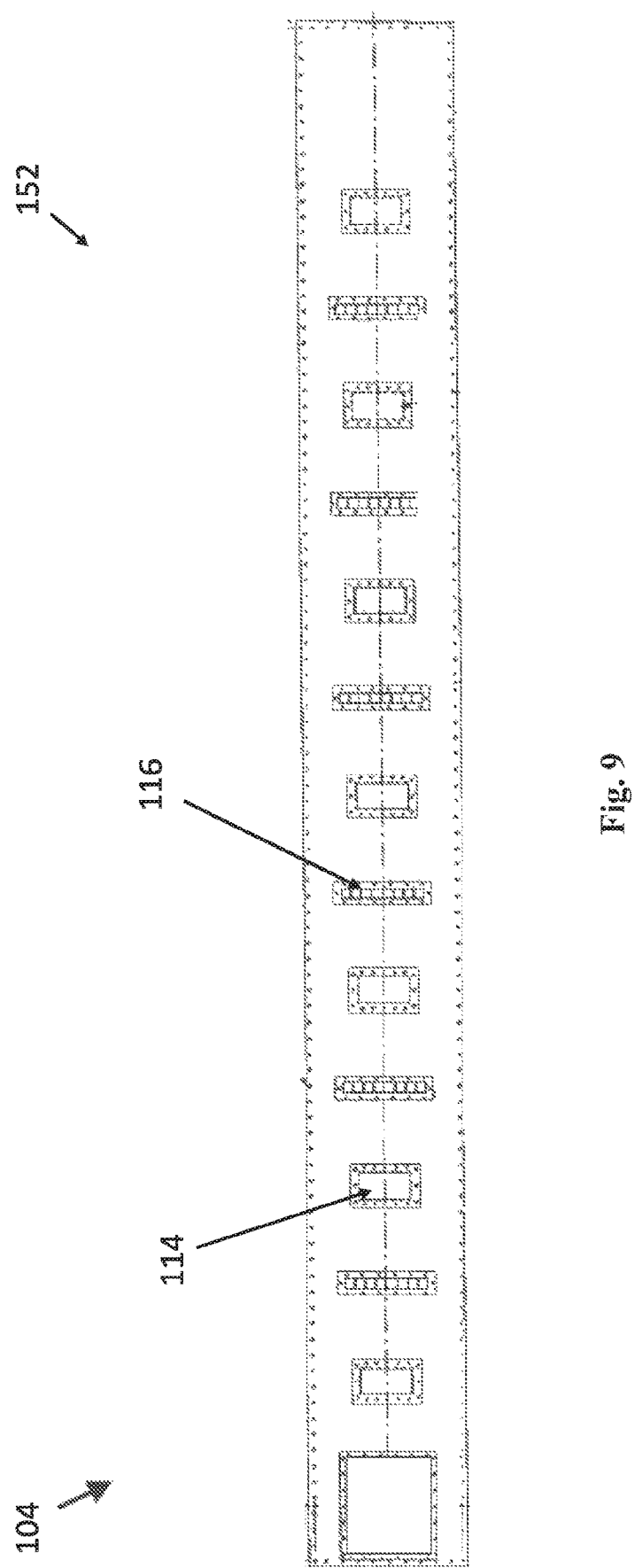
FIG. 9 is a top view of the alternative trough of the continuous mix system of FIG. 1.

Various example entry points for microwaves via the multiple waveguides 153 in a top of trough 102 are shown in FIG. 5. FIG. 9 shows alternative example entry points in a top of the alternative trough 104. Various other arrangements and configurations of troughs, conveyor units, and/or systems are also contemplated herein. Waveguides 153 are also referred to as microwave guides, herein. As shown in FIGS. 7 and 8, the alternative trough 104 can include a material inlet 110 and a material outlet 112. One or both of inlet 110 and outlet 112 can include a microwave suppression tunnel and/or features thereof as described herein.

In the conveyor unit 152 configuration of FIG. 6, the example, alternative trough 104 (or housing) of the continuous heating assembly that includes the auger 106. The auger 106 can optionally be heated and used to cause asphalt to be heated using liquid and/or microwave heating to be moved longitudinally along the trough 102 of the conveyor unit 152 during material heating, processing, or production. The auger 106 can also be caused to rotate directly or indirectly by the conveyor motor 161 (see FIG. 4) (or alternatively, an engine), according to various embodiments. Furthermore, the auger 106 can be caused by the conveyor motor 161 to rotate the auger 106 more slowly or more quickly according to various parameters, which can be based on need or usage, such as target temperature, microwave heating power, and the like. The motor 161 can have a power rating of 50-150 kW, 70-130 kW, 80-110 kW, or 90-100 kW in various embodiments. As shown the auger 106 can be helical, and in some embodiments the auger 106 can be single helical or double helical, among other variations. In yet further variations, a single trough 104 can comprise two separate augers 106, which can be counter-rotating or otherwise (not shown). As shown, a fluid connection can be attached to one or more ends of the auger 106, which can be used for additional auger-based heating or cooling of asphalt being produced or heated.

FIGS. 7-9 show various views of the alternative configuration 104, where various apertures within the alternative trough 104 cover are instead positioned in alternative locations as compared to trough 102. More specifically, the microwave inlets 114 and vents 116 are generally placed in line as shown with trough 104. Various embodiments that utilize trough 104 can be similar to embodiments that utilize trough 102, and various other configurations are also contemplated herein.

Figure 10:
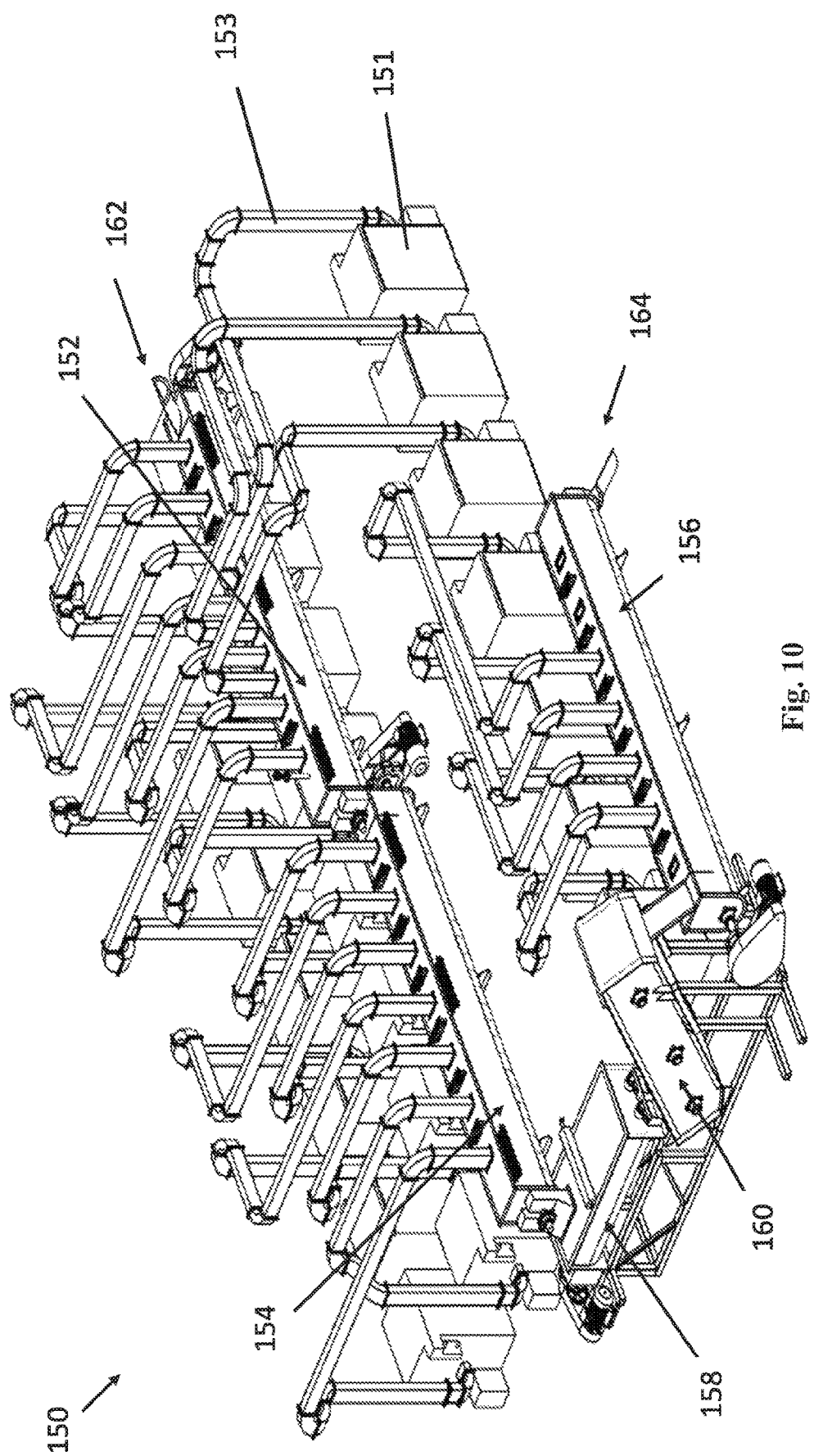
FIG. 10 is a perspective view of a multi-conveyor continuous mix system, according to various embodiments.
Figure 11:
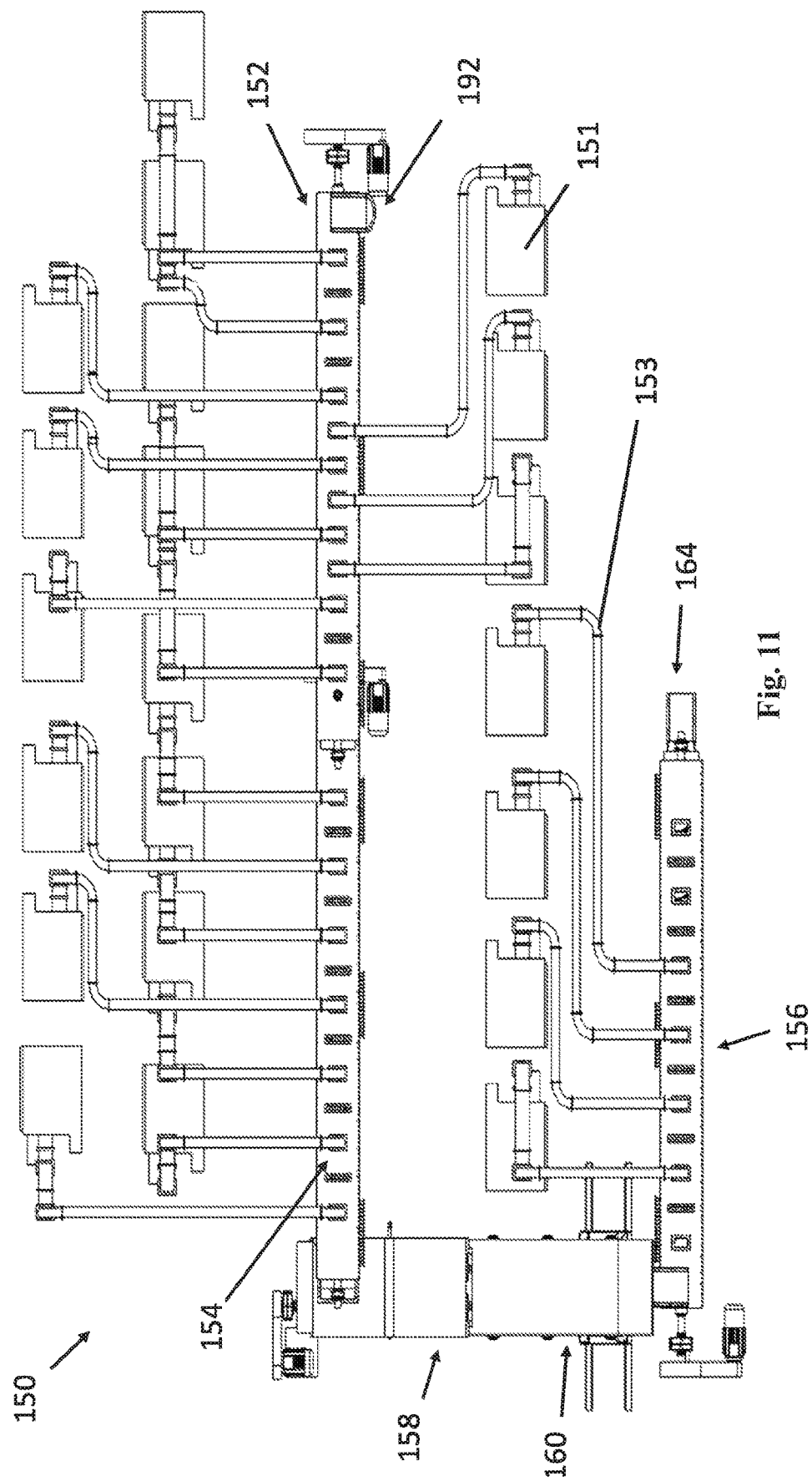
FIG. 11 is a top view of the multi-conveyor continuous mix system of FIG. 10.

FIGS. 10 and 11 show an example multi-conveyor continuous mix system 150. The system 150 as shown comprises an example of three conveyor units similar to conveyor unit 152 described above, in addition to a mixer 158, lifting conveyor 160, and two microwave suppression tunnels (e.g., 200, 202) shown at inlet 162 and outlet 164. Multiple microwave heating units 151 are also shown connected to the conveyor units via multiple corresponding waveguides 153 as described herein.

As shown, a first conveyor unit 152 receives a material to be heated, and the system 150 operates sequentially by passing the material to a second conveyor unit 154 following the first conveyor unit 152, and to a third conveyor unit 156 following the second conveyor unit 154. A mixer 158 (described in greater detail with reference to FIGS. 12 and 13), and a lifting conveyor 160 are also shown in line and between the second conveyor unit 154 and the third conveyor unit 156 in a sequential or serial arrangement. In particular, the mixer 158 can be located sequentially after an outlet of the second conveyor unit 154, and the lifting conveyor 160 can be located sequentially after the mixer 158 and before the third conveyor unit 156. The mixer 158 can be a pugmill, a drum mixer, mixing chamber, or any other type of suitable mixer as known in the art.

As described and shown herein, any number of conveyor units 152, 154, 156, etc. and any number of mixers 158, lifting conveyors 160 can be utilized in various systems such as 150. Moreover, the various components within the system 150 can be arranged in any suitable order according to a desire or need. Furthermore, microwave suppression tunnels (e.g., 200, 202) are preferably utilized at various inlets and/or outlets of the system 150 according to various embodiments.

The various conveyor units 152, 154, 156 can positioned such that the first conveyor unit 152 is vertically elevated and that the second and/or third conveyor units 154, 156 are positioned sequentially lower than the first conveyor unit 152 so as to utilize gravity to facilitate movement of material being heated between the various conveyor units when in use. In some embodiments, one or more lifting conveyor 160 can also be utilized to lift or raise the material being heated and reduce a total amount of height required for various conveyor units.

When used sequentially, the first conveyor unit 152 can heat the flowing material to a first temperature, the second conveyor unit 154 can heat the material to a second temperature greater than the first temperature, and the third conveyor unit 156 can heat the material to a third temperature that is greater than the second temperature according to various embodiments. Each conveyor preferably heats the material using microwave energy as the material flows and such that a third or final desired temperature is reached before the material exits the heating and/or processing system.

Any conveyor unit, such as the first conveyor unit 152, can further comprise a baffle 108 (see FIG. 8), preferably a vertical baffle or a baffle that is otherwise at least partially transverse to a direction of material flow within the conveyor unit 152, which is configured to restrict, guide, and shape the aggregate material as it proceeds through the first housing of the first conveyor unit 152. For instance, the baffle 108 can assist the auger 106 in restricting the flow of, leveling the material to a desired maximum level within the first conveyor unit 152, or reducing the particle size of received material to a desired diameter for processing and/or heating. In some embodiments, the material to be processed, before or after passing the baffle 108, has a maximum diameter or size of about eight inches. In other embodiments the maximum diameter is about six inches. In yet further embodiments, one or more impactor is added to reduce a maximum largest dimension of the aggregate material (e.g., RAP or other material). For example, in some embodiments at least some aggregate material is crushed or reduced in size within or prior to entering the first conveyor unit 152. Other conveyor units can also include various types of baffles (e.g., baffle 108) or other restrictive or material guiding members or features.

Figure 12:
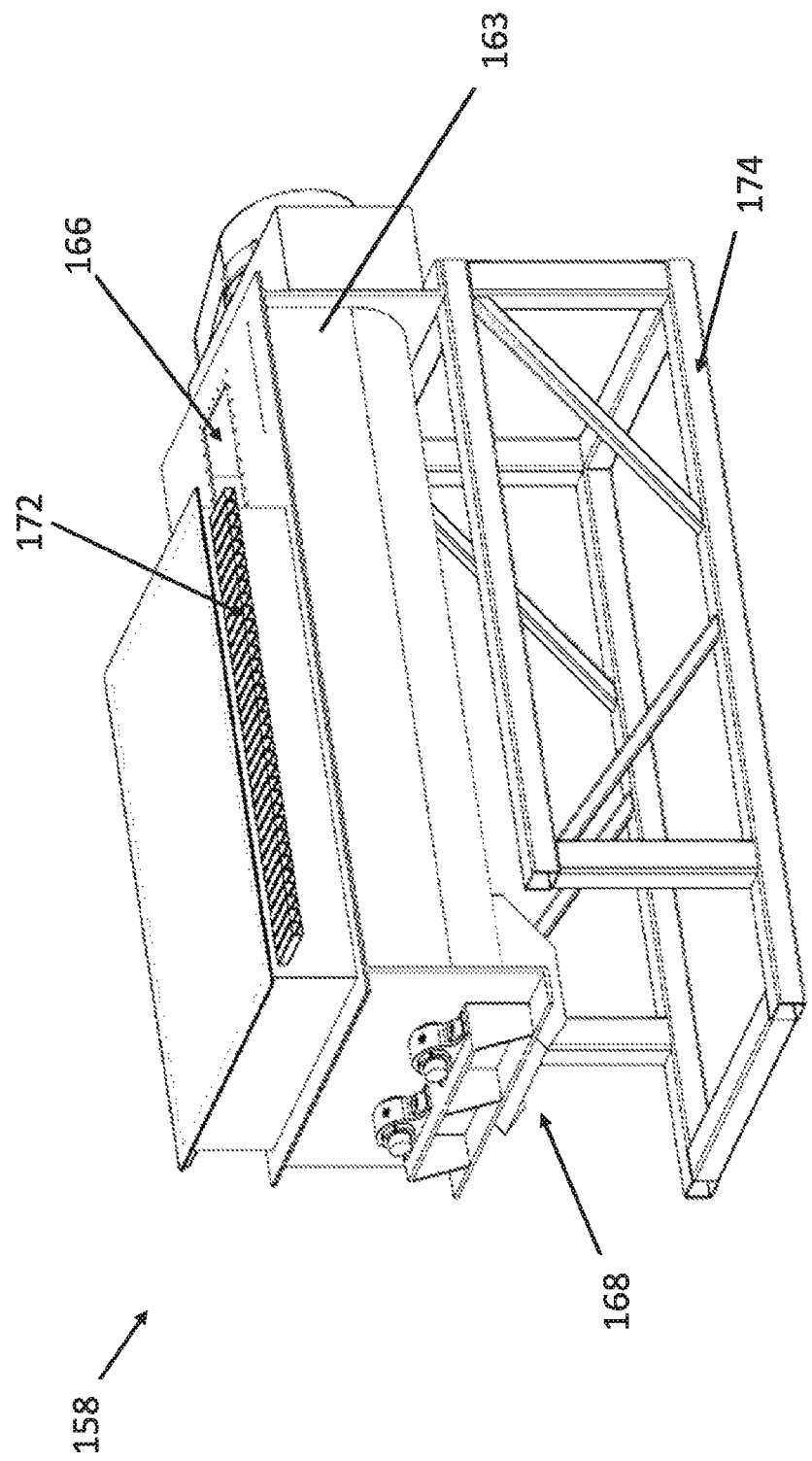
FIG. 12 is a perspective view of a mixer for use with the multi-conveyor continuous mix system of FIG. 10.
Figure 13:
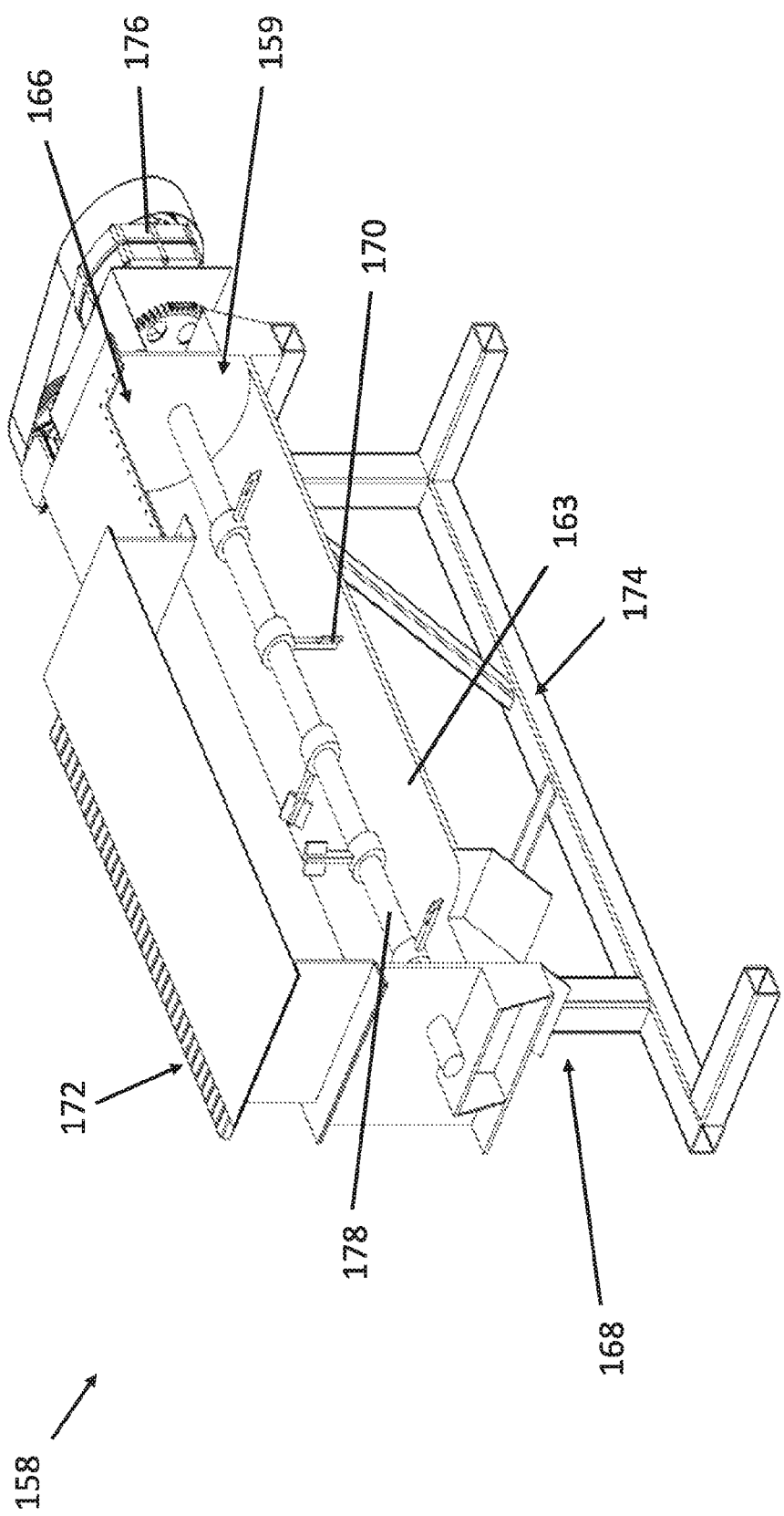
FIG. 13 is a partial cut-away view of the mixer of FIG. 12.

FIGS. 12 and 13 show the optional mixer 158 of system 150 in greater detail. The mixer 158 generally includes a mixer trough 163 supported by a mixer support structure 174, which can be height-adjustable in various embodiments. The mixer 158 also preferably comprises one or more mixer vents 172, and a mixer material inlet 166 and outlet 168. With reference in particular to the cross-sectional view of the mixer 158 in FIG. 13, the mixer trough 163 has an interior 159 for holding and mixing a material being processed. The mixer trough 163 also supports a mixer shaft 178 (e.g., via one or more bearings, not shown) that is operatively driven by a mixer motor 176. Connected to and protruding from the mixer shaft 178 are one or more mixer axially-mounted paddles 170 that are configured to mix a material held within the interior 159 of the mixer trough 163. Optionally, various heat exchanger components and/or heat recovery components or features can be positioned within or near the mixer 158. As shown the material is not heated during mixing within mixer 158. However, in alternative embodiments, the material can be heated while in the mixer 158. Various additive discussed herein can be added to the material while within the mixer 158, including one or more of sterol, bitumen, bio-derived products, petroleum-derived products, softening oils, and/or rejuvenating compositions. Multiple mixer shafts 178 can optionally be included in mixer 158.

Figure 14:
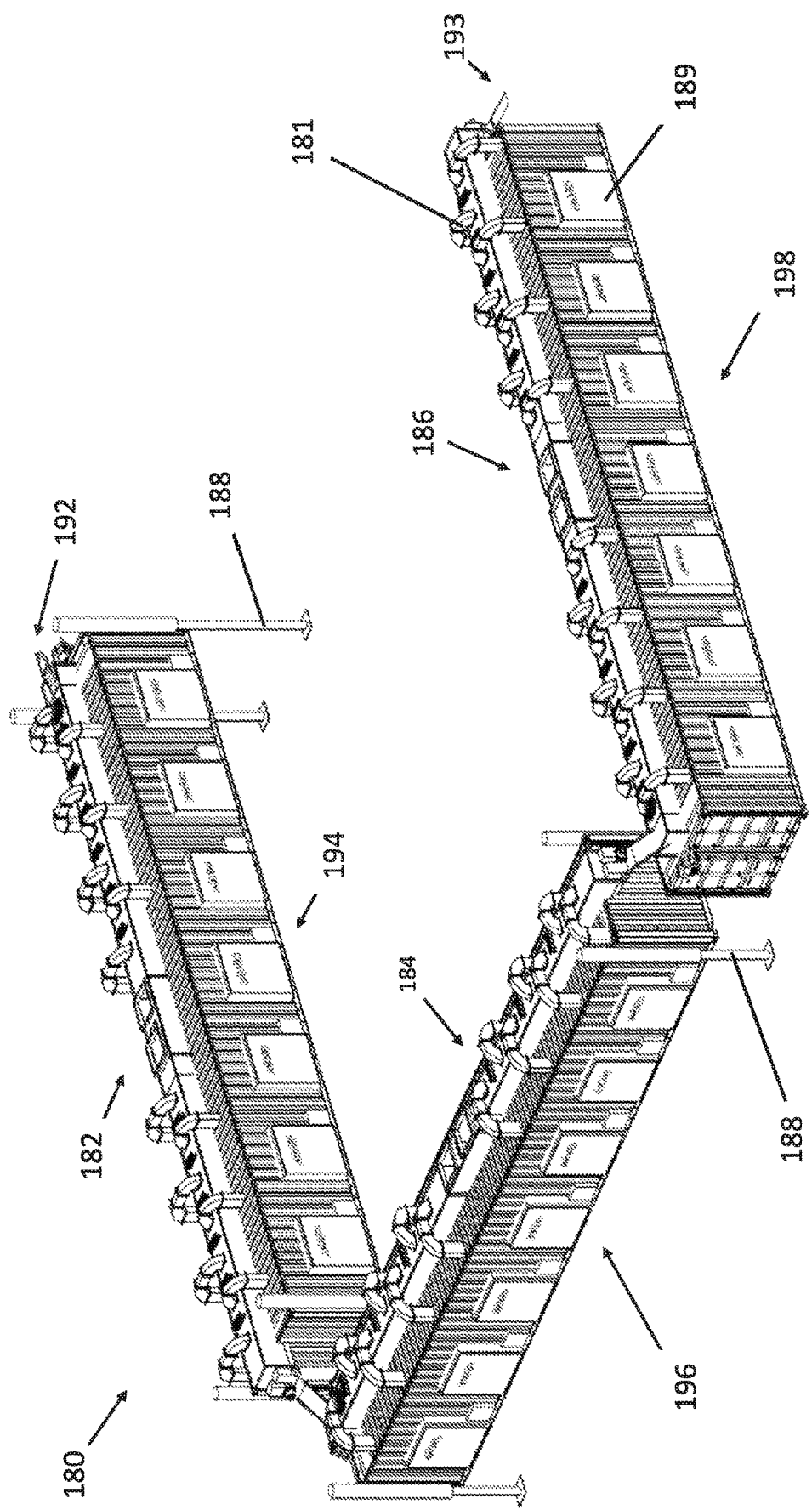
FIG. 14 is a perspective view of a mobile multi-conveyor continuous mix system, according to various embodiments.
Figure 15:
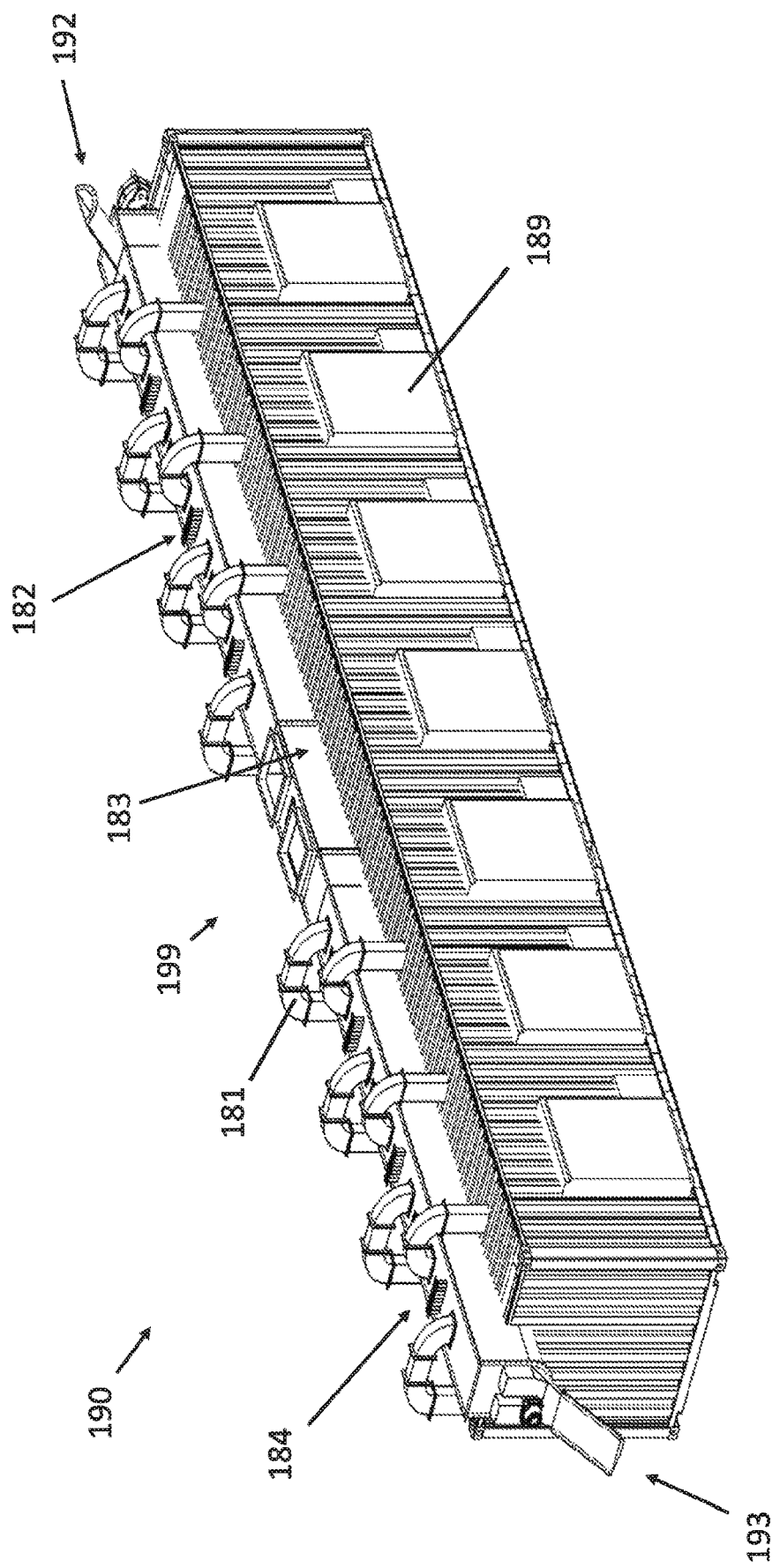
FIG. 15 is a perspective view of an alternative mobile multi-conveyor continuous mix system, according to various embodiments.

FIGS. 14 and 15 show various mobile multi-conveyor continuous mix systems, including 180 (three conveyor unit) and 190 (two conveyor unit).

Mobile and/or modular multi-conveyor continuous mix systems, such as systems 180 or 190, can be beneficially modular and easily transported. With mobile, modular systems, scalability of production can be improved because additional mobile units can be added for a jobsite as needed, provided there is sufficient space, and without having to do any additional fabrication.

As shown in FIG. 14, a three-module, mobile multi-conveyor asphalt mixer system 180 is shown. The system 180 as shown is composed of three generally similar mobile container units 194, 196, and 198, each comprising a conveyor unit 182, 184, and 186, respectively. As shown, each mobile container unit also comprises one or more microwave units 189, one or more waveguides 181, and optionally one or more system material inlet 192 and/or outlet 193. According to some embodiments, each mobile container unit 194, 196, and/or 198 is one or more reused or modified industry standard corrugated steel shipping container. Various openings and/or portions can be removed or modified such that the various components can fit onto or within each mobile container unit. As shown, the conveyor units 182, 184, 186 are generally positioned above or on an upper portion of the respective mobile container unit 194, 196, 198. The microwave heating or power units 189 are shown as being at least partially integrated into the mobile container units 194, 196, 198, and at least a portion of each microwave heating unit 189 can be exposed to the outside when installed within the mobile container unit.

Each mobile container unit 194, 196, 198 can further be provided with a mechanism for adjusting a vertical position of height of the mobile container unit operative components, such as the conveyor unit. The mechanism can include one or more adjustable height support structures 188, e.g., four with one positioned at each corner of each mobile container unit. As shown the first mobile container unit 194 is positioned at a more raised position, the second mobile container unit 196 is positioned at a less raised position, and the third mobile container unit 198 is positioned at a fully lowered position, e.g., set on a ground or floor without use of the adjustable height support structures 188. Although a mixer (e.g., 158) or a lifting conveyor (e.g., 160) are not shown in the system 180, in other embodiments one or more mixers and/or lifting conveyors can be utilized with the system 180, and can be integrated into one or more mobile container units, such as 194, 196, and/or 198.

FIG. 15 shows an alternative mobile multi-conveyor asphalt mixer system 190 with a single combined mobile container unit 199 with two conveyor units 182, 184 therein. As shown, a single container, such as a shipping container, can be modified to receive two conveyor units 182, 184 in sequence, and optionally can include a mixing and/or venting chamber 183 positioned between the first and second conveyor units 182, 184. Multiple systems 190 can be operated in parallel in order to adjust a throughput of heated material according to a particular need or desire for a mobile operation.

FIGS. 16-31 illustrate various arrangements of features of microwave suppression tunnels or chutes, such as the inlet suppression tunnel 202 or the outlet suppression tunnel 200. As used herein, the inlet suppression tunnel 202 and the outlet suppression tunnel 200 can be operatively similar and the features of either can be incorporated into the other in various embodiments. For example, although the inlet suppression tunnel 202 is shown with a single flap 218, multiple flaps 218 can be used in the inlet suppression tunnel 202 among other features of the outlet suppression tunnel 200.

Figure 16:
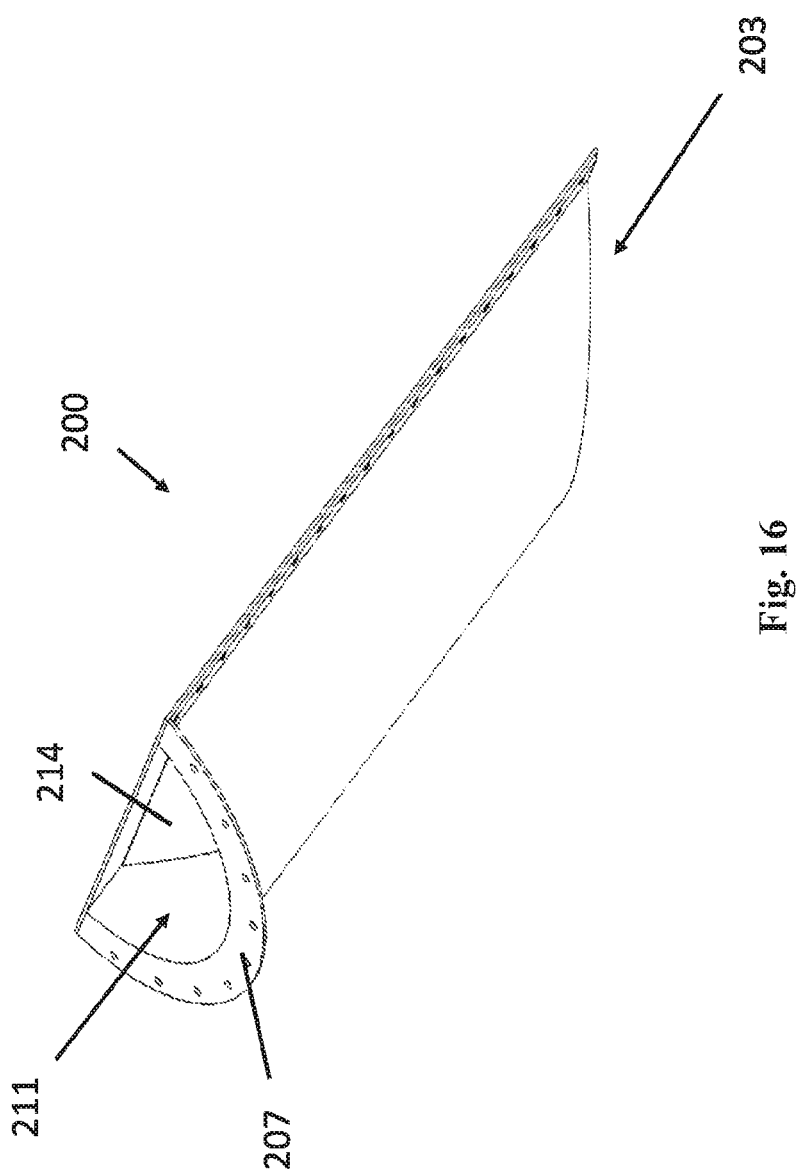
FIG. 16 is a perspective view of a microwave suppression tunnel, according to various embodiments.

As shown in FIG. 16, the outlet suppression tunnel 200 can be configured to include one or more absorbing, deflecting, or blocking flaps 214, variously including inlet and outlet suppression tunnel embodiments. Each suppression tunnel can be located attached to or comprised within a material inlet (e.g., inlet suppression tunnel 202) or outlet (e.g., outlet suppression tunnel 200) of various conveyor units as described herein. The example outlet suppression tunnel 200 preferably comprises a chute flange 207 for attachment at or near a conveyor unit outlet, or the like. The suppression tunnel 200 can also be configured for use as an "inlet" suppression tunnel with only minor changes, such as changing the location of the chute flange 207, a direction of permitted flap 214 movement relative to the outlet suppression tunnel 200, positioning, and the like. The flap 214 can be a single unit that is movable, flexible, or the like as described below. Flap 214 is attachable and/or pivotably attached to an upper portion of the outlet suppression tunnel 200.

Figure 17:
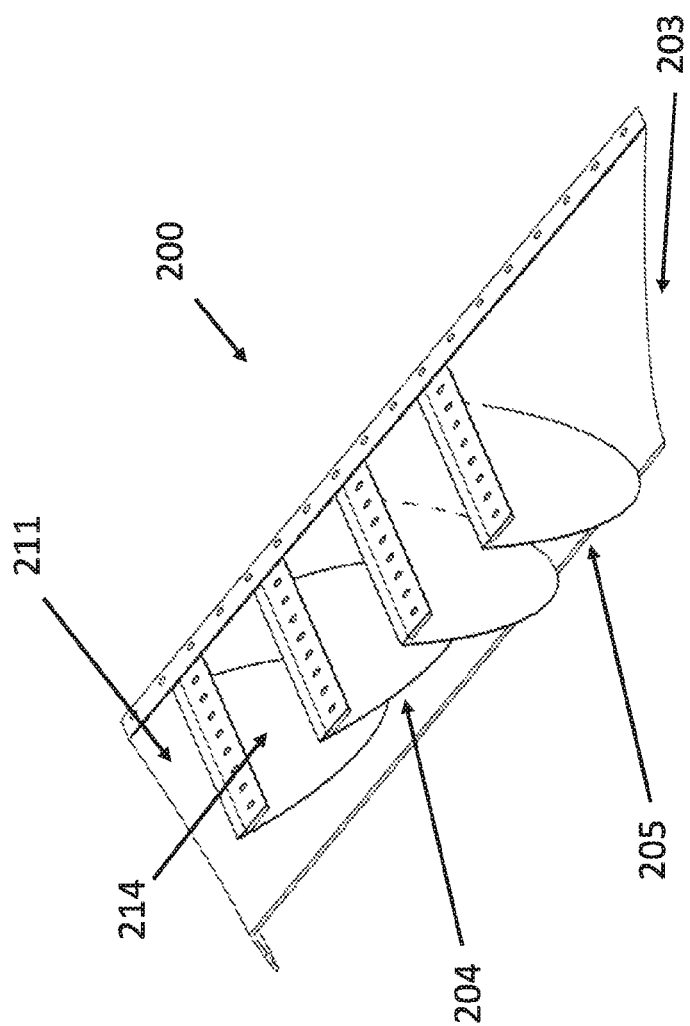
FIG. 17 is a partial cut-away view of the microwave suppression tunnel of FIG. 16.

Shown in perspective cross-sectional view in FIG. 17, the outlet suppression tunnel 200 includes flaps 214 that can move from a default, closed position 205 of the flap 214 as it contacts the outlet suppression tunnel 200, to a dynamic, open position 204 as material 209 (e.g., aggregate material) flows past (see FIG. 19), and applies a pressure on the flap 214, thereby opening it until the material 209 stops flowing or is cleared from the outlet suppression tunnel 200 (See FIG. 18). The outlet suppression tunnel 200 as shown in FIGS. 16 and 17 includes an attachment side, tunnel inlet 211, and an exit side, tunnel outlet 203.

An alternative embodiment of a flap 220 for use herein, is instead composed of multiple sub-portions 222, such as strips of microwave blocking, deflecting, or absorbing material, which are attached for an attachment flange 224 of the flap, which is usable for attachment (e.g., pivotable attachment) of flap 220 to an upper portion of the suppression tunnel 220. In yet further alternative embodiments of suppression flaps, chains, combinations of materials, or any other suitable microwave-suppression composition can be utilized.

Figure 22:
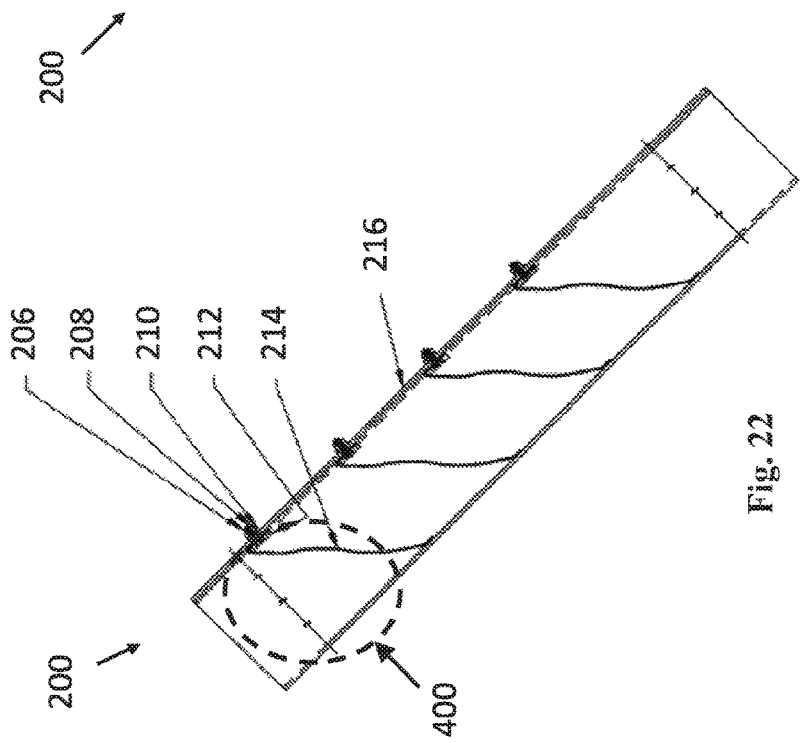
FIG. 22 is a cross-sectional side view of a U-shaped microwave suppression tunnel of an outlet side.

FIG. 22 is a cross-sectional side view of a U-shaped outlet suppression tunnel 200 of an outlet side. As shown, a series of four, single-ply (e.g., single layer) microwave suppression flaps 214 are shown in the outlet suppression tunnel 200 in a down position. At hardware detail section 400 of FIG. 28, flaps 214 can be attached to a top outlet side portion 216 of the outlet suppression tunnel 200 along with attachment hardware including bolt fastener 206, nut 208, bolt washer 210, metal bracket 212, and shielding mesh flap 214.

Figure 23:
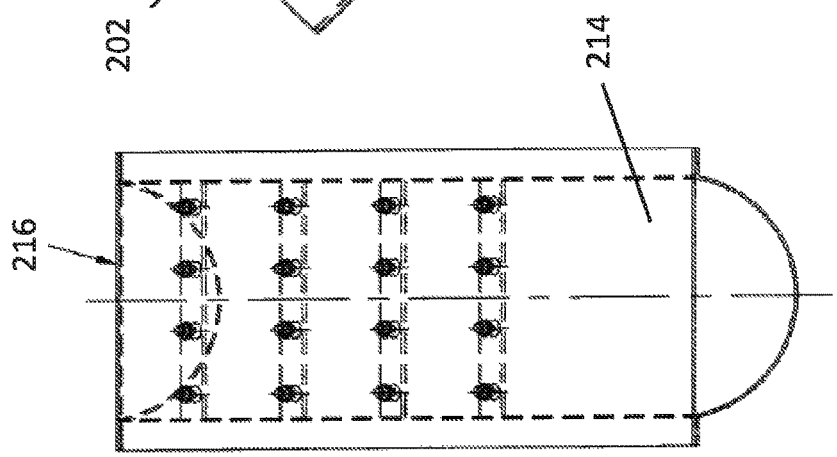
FIG. 23 is a cross-sectional top view of the U-shaped microwave suppression tunnel of FIG. 22.

FIG. 23 is a cross-sectional top view of the outlet U-shaped microwave outlet suppression tunnel 200 of FIG. 22. As shown, multiple attachment points (e.g., using hardware shown at FIG. 28) for each flap 214 are contemplated, although any suitable attachment or arrangement for the flap 214 is also contemplated herein.

Figure 24:
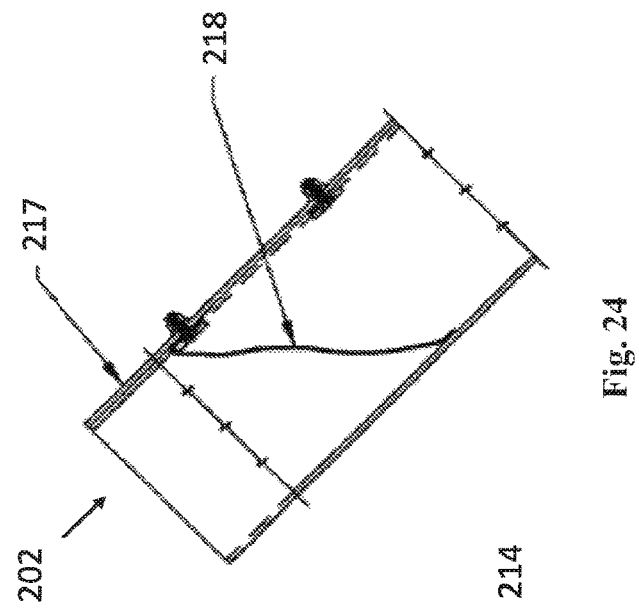
FIG. 24 is a cross-sectional side view of a U-shaped microwave suppression tunnel of an inlet side.

FIG. 24 is a cross-sectional side view of a U-shaped inlet microwave suppression tunnel 202 for use with or connection to an inlet side of a conveyor unit, such as conveyor unit 152 of the system 100. System 100 described above with reference in particular to FIGS. 1-4 can have inlet and outlet ends of a continuous motion particle pathway (e.g., motivated by auger 106 or other conveyance mechanism of the conveyor unit 152), an inlet suppression tunnel 202 can be used with or without an outlet suppression tunnel 200 as shown in FIGS. 22 and 23. A single, single-ply (e.g. single layer) microwave suppression flap 218 is shown in FIG. 24 attached to a top inlet side portion 217, e.g., using hardware as shown and described with respect to FIG. 28, below. As shown in the embodiments of FIGS. 22-24, the outlet/inlet suppression tunnels 200 and 202 use a single-ply (e.g., single layer) microwave-absorbing, deflecting, or blocking mesh flap 214 or 218, respectively. With reference to mesh flaps 214 and 218 and the like, the term "absorbing" is understood generally to optionally include any of absorbing, deflecting, blocking, and/or any other suppression technique of microwaves.

Figure 27:
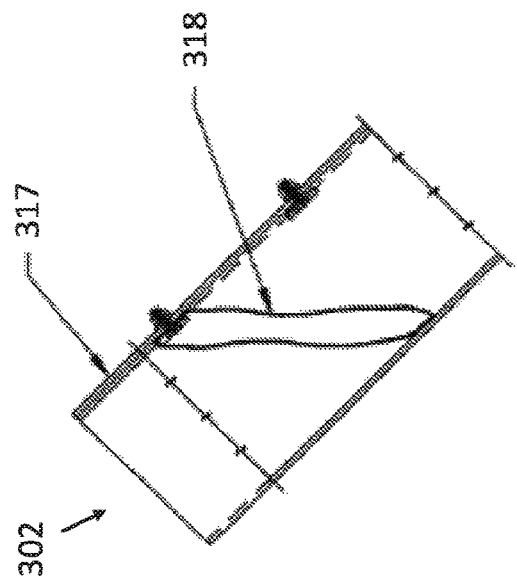
FIG. 27 is a cross-sectional side view of a rectangular microwave suppression tunnel of an outlet side.
Figure 26:
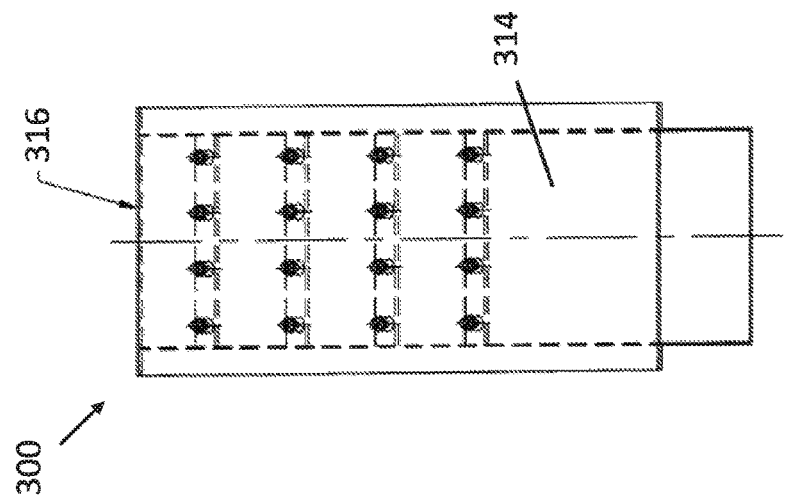
FIG. 26 is a cross-sectional top view of a rectangular microwave suppression tunnel of FIG. 25.
Figure 25:
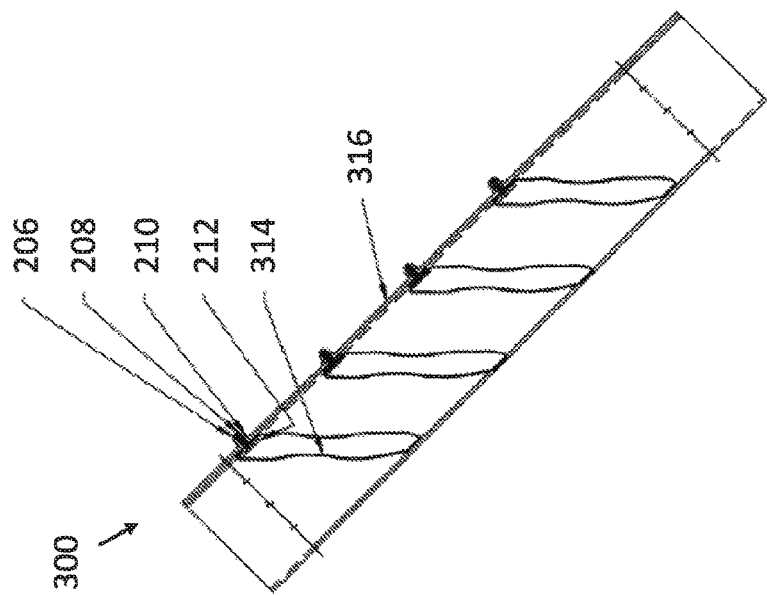
FIG. 25 is a cross-sectional side view of a rectangular microwave suppression tunnel of an inlet side.

FIGS. 25-27 illustrate alternative embodiments where mesh flap(s) 314, 318 are doubled over as two-ply for increased microwave absorption. FIGS. 25-27 are similar to FIGS. 22-24, respectively, with the exception of the folded over, two-ply (two layer) mesh flap(s) 314, 318.

FIG. 25 is a cross-sectional side view of a rectangular microwave outlet suppression tunnel 300. Four flaps 314 are shown, and each flap 314 can be attached to a top portion 316 of the outlet suppression tunnel 300 along with attachment hardware including bolt fastener 206, nut 208, bolt washer 210, metal bracket 212, and shielding mesh flap 314.

FIG. 26 is a cross-sectional top view of the rectangular microwave outlet suppression tunnel 300 of FIG. 25. FIG. 27 is a cross-sectional side view of a corresponding rectangular microwave inlet suppression tunnel 302. As shown, folded flap 318 is attached to top outlet side 317.

FIG. 28 shows greater detail of hardware detail section 400 of FIG. 22. As shown, a flap 214 can be attached to (e.g., a top inlet or outlet side portion) of a suppression tunnel along with attachment hardware including bolt fastener 206, nut 208, bolt washer 210, metal bracket 212, and shielding mesh flap 214. FIG. 28 shows a side view of a non-looped, single-ply microwave absorbing, deflecting, or blocking flap 214 with a microwave-absorbing, deflecting, or blocking mesh described in greater detail herein that is attached to an upper portion of a suppression tunnel (or chute thereof, etc.). Only one example fastening arrangement is shown at hardware detail section 400, but other arrangements are contemplated. In other embodiments, the flap 214 with mesh can be looped, causing a two-ply (e.g., two layer) flap to be attached at two ends in a manner similar to the fastening arrangement shown at hardware detail section 400.

Flap 214 as shown in FIG. 28 (and any other embodiments of flaps herein) is preferably electrically grounded to a heating system frame 201. The heating system frame 201 is preferably grounded to a power source electrical grid (not shown) according to various embodiments.

Turning now to FIGS. 29A-29C and 30A-30C, various cross-sectional end views are shown that provide detail of flap configuration within a suppression tunnel or chute in addition to flap articulation or flexing that occurs during continuous material (e.g., asphalt) production and movement along the tunnel.

Inlet and/or outlet microwave suppression tunnels (e.g., 202, 200, etc.) can be positioned and connected relative to the continuous heating assembly or system as described herein. During heating operation, it is possible that at least some microwave energy will not be absorbed by material being heated or other components within the assembly. This non-absorbed, escaped, or "leaked," microwave energy can be unsafe, undesirable, or otherwise beneficial to avoid in practice. In order to address this shortcoming, one or more movable and/or pivotable flaps can be positioned at the inlet tunnel, the outlet tunnel, or both.

In various embodiments, an example microwave absorbing, deflecting, or blocking flap, for inlet or outlet of material, such as asphalt, can comprise a flexible mesh configured to feely pivot when contacted by moving aggregate material as described herein. Inlet and/or microwave suppression tunnels can have rounded, rectilinear, or a combination of the two for an outline along the various tunnels.

In various embodiments, the various microwave suppression tunnels are preferably in a substantially horizontal position, but preferably at an angle of no more than 45 degrees from horizontal.

FIG. 29A is a cross-sectional end view of a U-shaped microwave suppression tunnel configuration 500A with a top-mounted pivoting mesh flap 506 in a closed position. Example attachment points 502 show one alternative mounting configuration that allows flap 506 to pivot within U-shaped flap surround 508. The flap 506 can pivot along a top flap portion or axis 504, or can bend alternatively when a pressure is applied to the flap 506.

FIG. 29B is a cross-sectional end view of a U-shaped microwave suppression tunnel configuration 500B, similar to 500A of FIG. 29A with the mesh flap 506 in a partially open position. As particles are moved along a trough defined by surround 508, flap 506 can be caused to pivot or bend such that an opening 510 between the flap 506 and the surround 508 is revealed. Opening 510 can allow material particles to pass while allowing minimal microwaves to escape. Particles of material causing flap 506 to open can at least partially block microwaves that would otherwise have escaped the microwave suppression tunnel (e.g., outlet suppression tunnel 200 or inlet suppression tunnel 202, among other examples described herein).

FIG. 29C is a cross-sectional end view of the U-shaped microwave suppression tunnel configuration 500C similar to 500A of FIG. 29A with the mesh flap 506 in a fully open position, causing a larger opening 510 than in configuration 500B.

The embodiments shown in FIGS. 29A-29C can also be modified to include a rectangular flap 606 with a corresponding rectangular tunnel or chute surround 608, as shown in FIGS. 30A-30C.

FIG. 30A is a cross-sectional end view of a rectangular microwave suppression tunnel configuration 600A with a top-mounted pivoting mesh flap 606 in a closed position. Example attachment points 602 show one alternative mounting configuration that allows flap 606 to pivot within rectangular flap surround 608. The flap 606 can pivot along a top flap portion or axis 604, or can bend alternatively when a pressure is applied to the flap 606.

FIG. 30B is a cross-sectional end view of a rectangular microwave suppression tunnel configuration 600B, similar to 600A of FIG. 30A with the mesh flap in a partially open position. As particles are moved along a trough defined by surround 608, flap 606 can be caused to pivot or bend such that an opening 610 between the flap 606 and the surround 608 is revealed. Opening 610 can allow particles to pass while allowing minimal microwaves to escape. Material particles causing flap 606 to open can at least partially block microwaves that would otherwise have escaped the microwave suppression tunnel.

FIG. 30C is a cross-sectional end view of the rectangular microwave suppression tunnel configuration 600C similar to 600A of FIG. 30A with the mesh flap 606 in a fully open position, causing a larger opening 610 than in configuration 600B.

Many other microwave suppression system flap and tunnel configurations are also contemplated herein, and the examples above are merely shown as selected examples of preferred embodiments. For example, various example and alternative cross-section shapes of chute are shown at FIG. 31. A generally square chute cross-section is shown at 226, a generally round chute cross-section is shown at 228, and a generally rectangular chute is shown at 230. Any other shape of chute or suppression tunnel (and correspondingly shaped flap[s]) is also contemplated herein.

Figure 32:
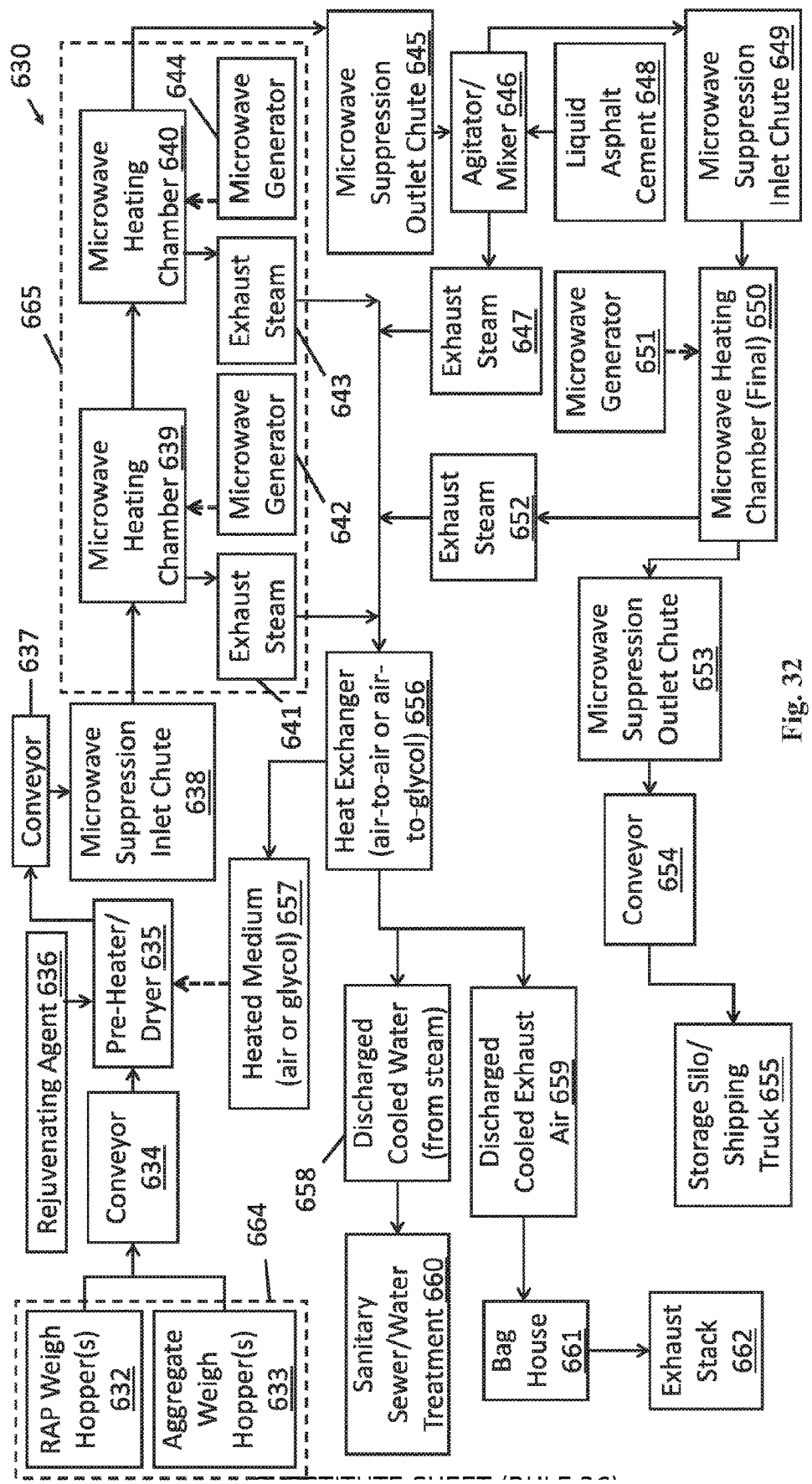
FIG. 32 is a flowchart of a process according to various embodiments of the present disclosure.

FIG. 32 is a flowchart of an example process 630 according to embodiments of the present disclosure.

Process 630 can start with operations 632 and/or 633. At operation 632, one or more hoppers (e.g., containers) of RAP are optionally weighed. At operation 633, one or more hoppers (e.g., containers) of aggregate are optionally weighed. As shown at 664, multiple bins of material (e.g., RAP, aggregate, asphalt etc.) can be added with different materials to obtain desired final material blend. The final material blend is referred to as material below for simplicity.

Next, process 630 proceeds to operation 634, where a conveyor (e.g., a loader unit) carries material (e.g., the RAP and/or aggregate) to a pre-heater or drier at 635. Optionally at operation 636, a rejuvenating agent is added to the material. Also at 635, energy can be transferred to the pre-heated or dryer from a heated medium, such as air or glycol from operation 657, as discussed further below.

Following operation 635, the material can be further moved using another conveyor at operation 637 until the material reaches a microwave suppression inlet chute (or tunnel) at operation 638. Next, the material can proceed to a microwave heating chamber (e.g., a trough of a conveyor unit), which can emit heated exhaust steam at 641, and can receive power via microwaves emitted by a microwave generator at 642 (e.g., via one or more waveguides as discussed herein).

Optionally, the material can then proceed to another microwave heating chamber of another conveyor unit at 640, which can also omit exhaust steam at 643 and/or receive microwave energy from another microwave generator at 644 (e.g., a microwave heating unit, etc.). As shown at 665, multiple heating sections can be added to get the required energy input to reach a specific throughput. After the material is sufficiently heated in accordance with desired specifications, the material can proceed to as past a microwave suppression outlet chute (or tunnel) at 645.

After the material passes the microwave suppression outlet chute at 645, optionally the material can enter an agitator or mixer at 646. The material when in the mixer can emit exhaust steam at 647, and can optionally receive liquid asphalt cement at 648. Once the material is sufficiently mixed at 646, the material can proceed to another microwave suppression inlet chute (or tunnel) at 649. At 650 (and similar to 639 and 640), the material can proceed to a third microwave heating chamber at 650. The chamber 650 can also receive microwave energy via one or more microwave generator at 651, and exhaust steam can also be used to extract heat from the heated material at 652. Once the material is heated to a desired, final temperature at 650, the material can proceed through another microwave suppression outlet chute at 653, and can proceed via a conveyor 654 to a storage medium, such as a silo or shipping truck at 655, among other destinations for storage or use, including at various remote locations.

Exhaust steam heat received at 641, 643, and/or 652 can be recovered as waste heat using one or more heat exchanger 656. The heat exchanger 656 can be an air-to-air heat exchanger, or an air-to-liquid (e.g., glycol) heat exchanger in various embodiments. The heat exchanger 656 can thereafter provide heat via a heated medium at 657 to be used in the pre-heater or dryer 635 as discussed above.

Also in thermal communication with the heat exchanger at 656 can be discharged cooled water (from steam) at 658 and/or discharged cooled exhaust air at 659. The discharged cooled water at 658 can then proceed to a sanitary sewer or water treatment at 660. Furthermore, the discharged cooled exhaust air at 659 can proceed to a bag house at 661, and then to one or more exhaust stacks at 662.

Figure 33:
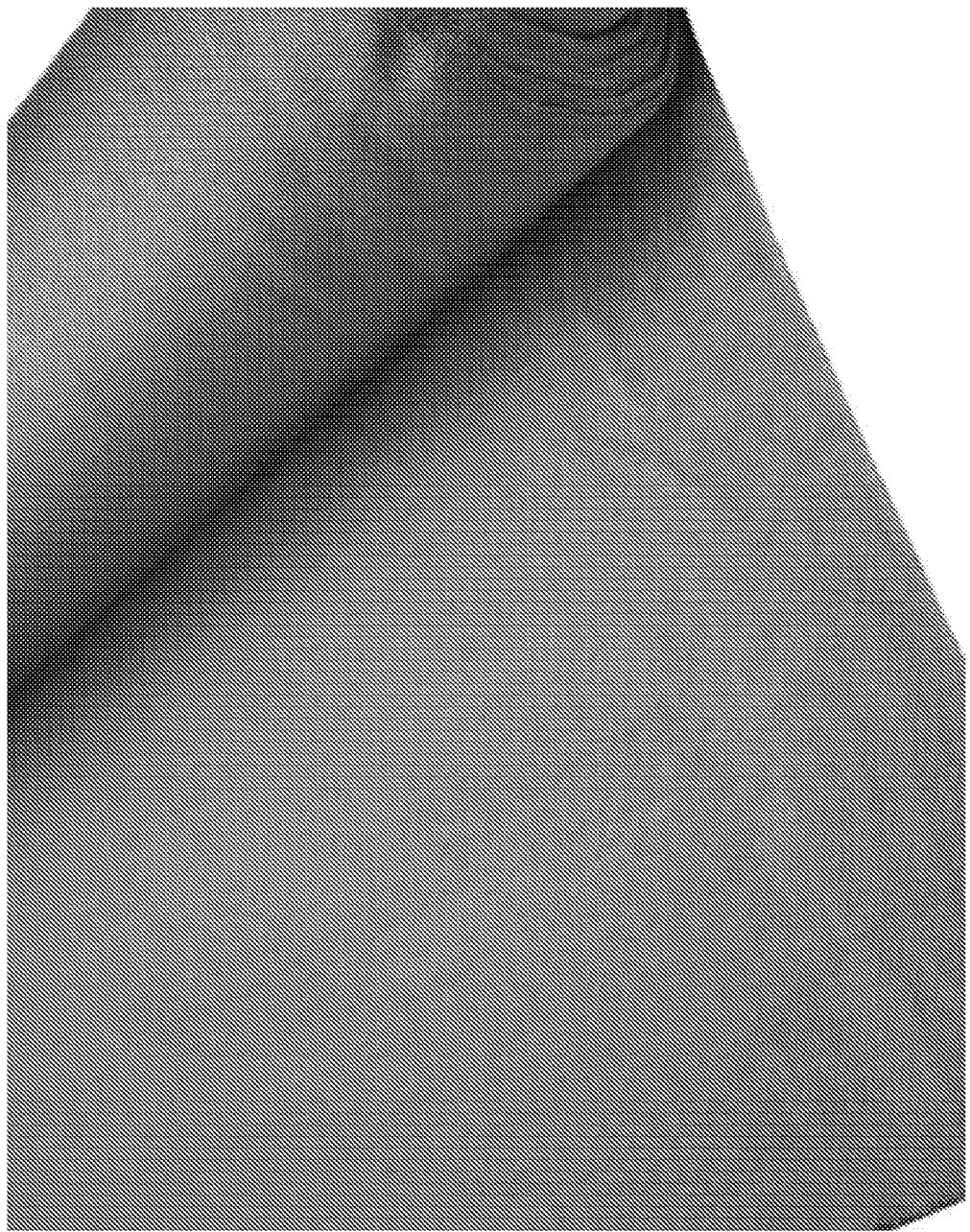
FIG. 33 is a detail view of an RFI shielding mesh according to various embodiments.
Figure 34:
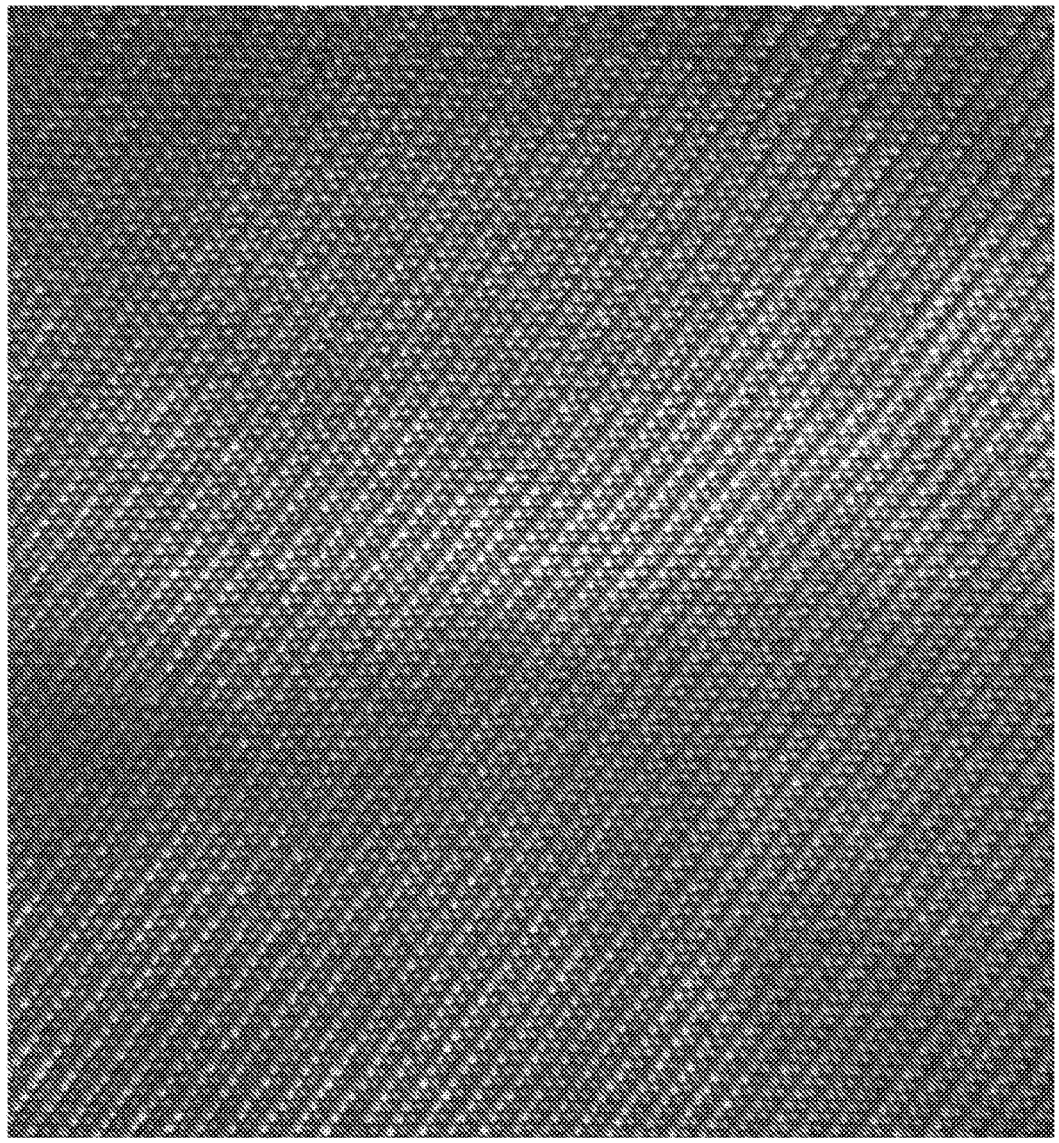
FIG. 34 is another view of the RFI shielding mesh of FIG. 33.

FIGS. 33 and 34 show an example stainless steel RFI shielding mesh 700. The mesh 700 can be a carbon cover metal.

For example, the shielding mesh 700 can be sourced from Aaronia USA/Aaronia AG. The shielding mesh 700 can be an 80 dB Stainless Steel RFI Shielding Aaronia X-Steel model, which can provide military or industrial grade screening to meet various demanding usage cases. In some examples, the shielding mesh 700 can be coated with a polytetrafluoroethylene (i.e., PTFE or "Teflon") coating, silicone, polyurethane, plastic, or the like.

The steel mesh 700 can be highly durable, effective up to about 600 degrees Celsius (° C.), operate under a very high frequency range, and be permeable to air.

In more detail, shielding mesh 700 is an Aaronia X-Steel component that can operate to at least partially shield both radio frequency (RF) and low frequency (LF) electric fields.

Some specifications of the shielding mesh 700 can include a frequency range of 1 MHz to 50 GHz, a damping in decibels (dB) of 80 dB, a shielding material including stainless steel, a carrier material including stainless steel, a color of stainless steel (silver), a width of 0.25 m or 1 m or some variation, a thickness of about 1 mm, available sizes of about 0.25 m$^2$ or 1 m$^2$, a mesh size of approximately 0.1 mm (multiple ply/layer), and a weight of approximately 1000 g/m$^2$. The shielding mesh 700 can be suitably durable, and can be configured and rated for use in industrial or other applications, can have a temperature range up to 600° C., can be permeable to air, and permit very easy handling.

In some examples, the shielding mesh 700 can be EMC screening Aaronia X-Steel from Aaronia AG, which can be made from 100% stainless steel fiber. The shielding mesh 700 can meet various industrial or military standards. The shielding mesh 700 can be very temperature stable for at least 600° C., does not rot, is permeable to air. The shielding mesh 700 can be suitable for EMC screening of air entrances and can be very high protective EMC clothing, etc. The shielding mesh 700 can protect against many kinds of RF fields and can offer a 1000-fold better shielding-performance and protection especially in the very high GHz range as compared to various other types of shielding mesh. The shielding mesh 700 provides high screening within the air permeable EMC screening materials.

Application examples of the shielding mesh 700 include: Radio & TV, TETRA, ISM434, LTE800, ISM868, GSM900, GSM1800, GSM1900, DECT, UMTS, WLAN, etc.

Figure 35:
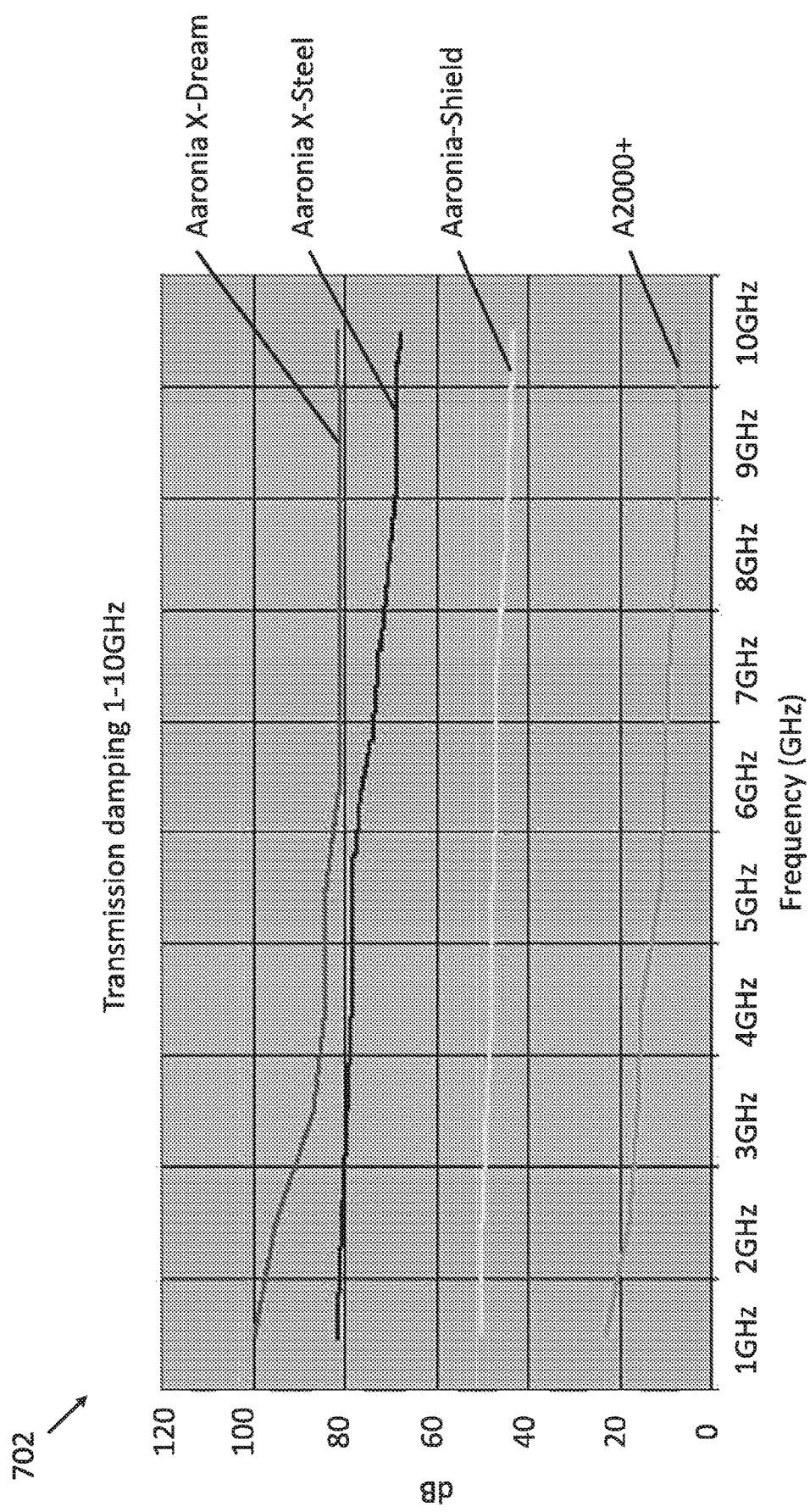
FIG. 35 is a transmission damping chart of the shielding mesh according to FIG. 33.

FIG. 35 shows a transmission damping chart 702 for various shielding mesh examples from 1-10 GHz in terms of dB for the mesh 700 of FIGS. 33 and 34. As shown, four shielding meshes are depicted. As shown, in descending order for transmission damping across 1-10 GHz, are Aaronia X-Dream, Aaronia X-Steel, Aaronia-Shield, and A2000+.

Figure 36:
FIG. 36 is a detail view of another shielding mesh according to various embodiments.
Figure 37:
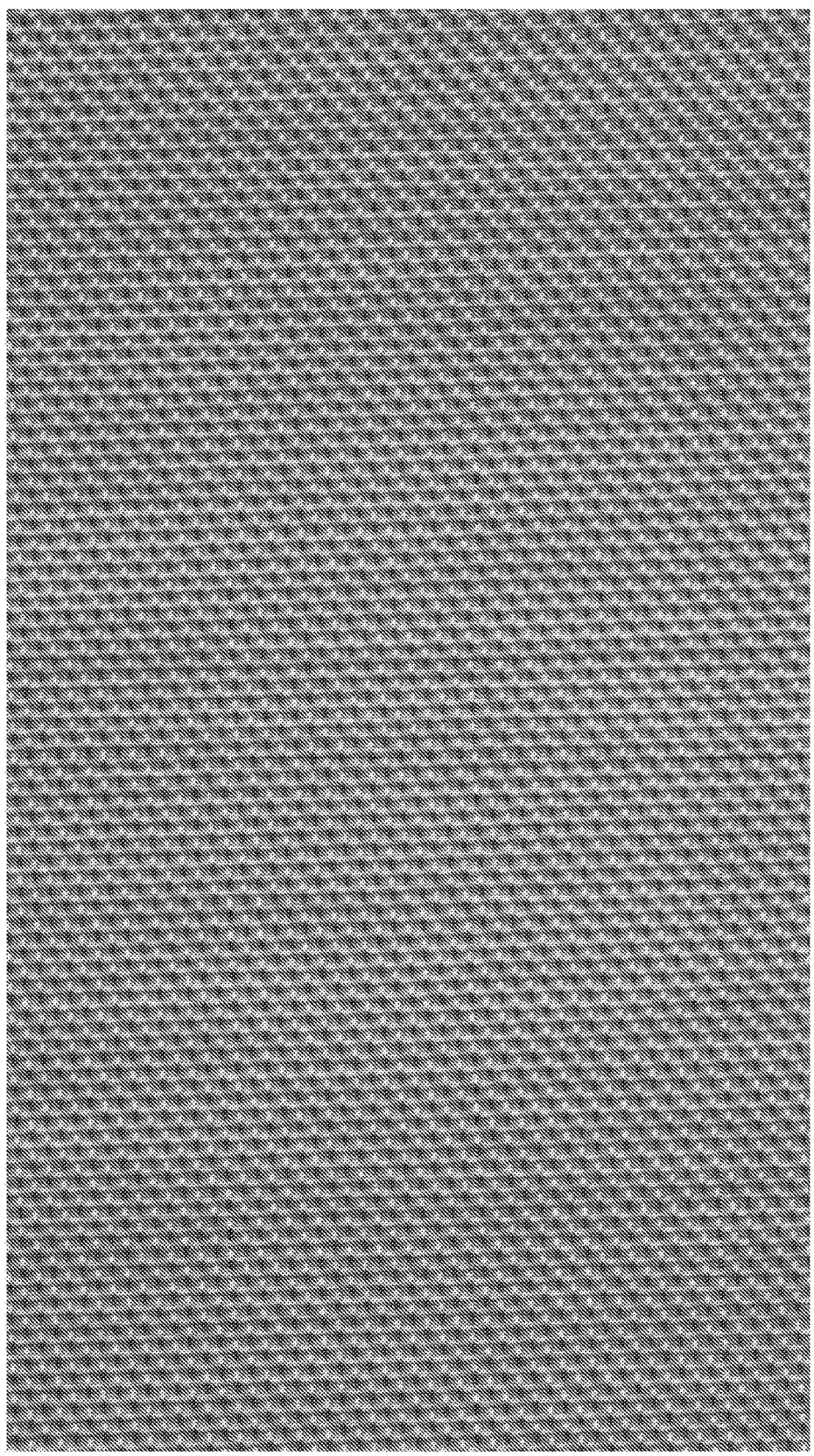
FIG. 37 is another view of the shielding mesh of FIG. 36.

FIGS. 36 and 37 show another example shielding mesh, a fireproof shielding fabric mesh 800.

The fireproof shielding fabric mesh 800 can be sourced from Aaronia AG, and is a stainless steel EMC/EMF shielding mesh for usage under extreme conditions. The fireproof shielding mesh 800 is usable up to 1200° C., can be half transparent, has high attenuation, and is both odorless and rot resistant. The fireproof shielding fabric mesh 800 has microwave attenuation as follows: 108 dB at 1 kHz, 100 dB at 1 MHz, 60 dB at 100 MHz, 44 dB at 1 GHz, 30 dB at 10 GHz.

Some specifications of the fireproof shielding fabric mesh 800 include: lane Width: 1 m; thickness: 0.2 mm; mesh size: about 0.1 mm; color: stainless steel; weight: approx. 400 g/m; usable until about 1200° C.; yield strength: 220 MPa; tensile strength: 550 MPa; hardness: 180 HB; can be breathable; odorless; transparent; rot resistant; frost proof; washable; foldable; bendable; mesh material: stainless steel.

The fireproof shielding fabric mesh 800 has screening performance for static fields of: 99.9999% to 99.99999% (e.g., when grounded). The fireproof shielding fabric mesh 800 has screening performance for low electric fields of 99.9999% to 99.99999% (e.g., when grounded).

The fireproof shielding fabric mesh 800 is suitable for industrial applications as well as for research and development. The fireproof shielding fabric mesh 800 has been specifically designed for use under adverse conditions (salt air, extreme temperatures, vacuum, etc.).

The fireproof shielding fabric mesh 800 is made of 100% stainless steel, is temperature stable up to 1200° C., has a high microwave attenuation, and yet is breathable. The material of mesh 800 absorbs reliable E&H fields. In particular, in the kHz and low MHz range mesh 800 offers a high shielding factor of up to 108 dB (E-field). Mesh 800 is easy to process and can be cut with a standard pair of scissors.

Figure 38:
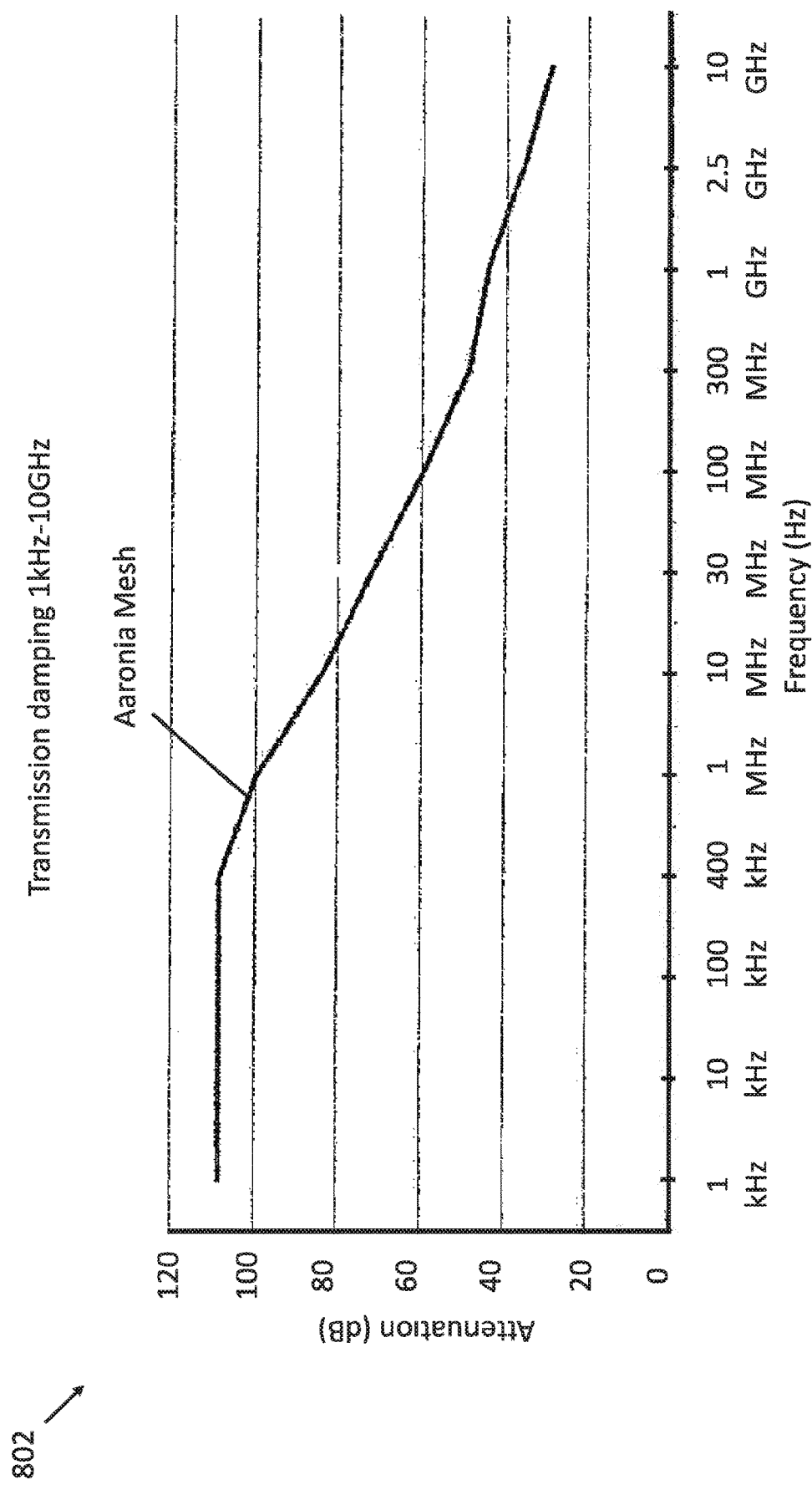
FIG. 38 is a transmission damping chart of the shielding mesh of FIG. 36.

FIG. 38 is a transmission damping chart 802 from 1-10 GHz in terms of dB for the fireproof mesh 800 of FIGS. 36 and 37.

As used herein, a conveyor or conveyor unit can be any vessel or mechanism that moves material from an inlet to an outlet. The product or material being heated can be carried in various examples by another type of conveyance mechanism, such as by a unique conveyor belt. Therefore, in some alternative embodiments a conveyorized modular industrial microwave power system can be employed instead of an auger-based system such as system 100.

Based on power requirements, two or more microwave power modules or heating units can be installed on the same conveyor. To assure uniform heat distribution in a large variety of load configurations, a multimode cavity can be provided with a waveguide splitter with dual microwave feed points and mode stirrers.

In embodiments that use a conveyor belt, a belt material and configuration are selected based on the nature of the product being heated. Each end of the conveyor is preferably also provided with a special vestibule to suppress any microwave leakage. Air intake and exhaust vents or ports are provided for circulating air to be used in cases where vapors or fumes are developed during the heating process.

Unlike home microwave ovens, example industrial microwave systems contemplated herein preferably separate microwave generation from a heating/drying cavity such as a trough or housing. An example industrial microwave heating system can be constructed to use one or more microwave generator units. Example microwave generator and heating units come in 75 kW and 100 kW (output power) models. Using special ducts called waveguides or microwave guides, the microwave energy is carried to one or more industrial microwave cavities. In a conveyor belt-based embodiment, a conveyor belt, auger, etc. carries the product through the cavities. A simple example system may include one microwave generator and one cavity, while a larger and/or more complex system may have a dozen generators and six cavities. This inherent modularity provides great flexibility in scaling a system, or building systems, which can be easily expanded in the future.

Certain example embodiments of the present disclosure are described as follows. According to an embodiment herein a method of processing aggregate material comprises receiving a quantity of aggregate material at a first conveyor unit provided in a first housing. The method also comprises performing a first processing step to the quantity of aggregate material within the first conveyor unit using at least one microwave generator coupled to the housing of the first conveyor unit, wherein the aggregate material is heated within the first conveyor unit.

In optional embodiments, the method also comprises receiving the quantity of aggregate material at a mixer, wherein a mixing step is performed to the aggregate material within the mixer. In further optional embodiments, at least some of the aggregate material is crushed or reduced in size before or during the first processing step. In further optional embodiments, the method further comprises receiving the quantity of aggregate material at a second conveyor unit provided in a second housing; and performing a second processing step to the quantity of aggregate material within the second conveyor unit using the at least one microwave generator coupled to the housing of the second conveyor, wherein the aggregate material is heated to a greater temperature in the second processing step than in the first processing step. According to various embodiments, the method further comprises receiving the quantity of aggregate material at a third conveyor unit provided in a third housing; and performing a third processing step to the quantity of aggregate material within the third conveyor unit using the at least one microwave generator coupled to the housing of the third conveyor, wherein the aggregate material is heated to a greater temperature in the third processing step than in the first or second processing steps. In yet further embodiments, the quantity of aggregate material received at the mixer is received from a conveyor unit, and wherein the aggregate material enters a different conveyor unit after exiting the mixer. In further embodiments, the at least first conveyor unit comprises a number and arrangement of conveyor units selected such that a desired result is reached. In further embodiments, at least two conveyor units are arranged in series. In further embodiments, at least two conveyor units are arranged in parallel. In further embodiments, a processing speed of the at least one conveyor unit is adjusted based on the series or parallel arrangement. In further embodiments, the processing speed can be reduced to increase heating, or can be increased to reduce heating of the aggregate material in the at least one conveyor unit. In further embodiments, for a given processing speed, two or more conveyor units operating in parallel increases an aggregate material throughput based at least on the number of parallel conveyor units. In further embodiments, the method further comprises using a microwave radar of a frequency different than any heating microwaves to perform at least a level measurement. In further embodiments, based on the level measurement at least one of a processing speed and heating power is adjusted. Also contemplated herein is a product made by any system or method of any preceding claim.

Another method is contemplated herein. Specifically, a method for portably providing processed aggregate material upon demand is disclosed. The method comprises receiving a request for a first quantity of processed aggregate at a first location. The method also comprises determining that the first location has a first group of characteristics that include at least a distance from the first location to an external power source of a first power output. The method also comprises deploying a portable system for processing aggregate material at the first location based on at least the first quantity of aggregate and the first group of characteristics, the portable system comprising. The first group of characteristics comprises at least one power generator configured to provide at least the first power output, at least one microwave generator operatively coupled to the power generator at least one conveyor unit configured to receive and process a quantity of aggregate material. The method further comprises applying microwave energy to the aggregate material within the conveyor unit of the portable system.

These and other advantages will be apparent to those of ordinary skill in the art. While the various embodiments of the invention have been described, the invention is not so limited. Also, the method and apparatus of the present invention is not necessarily limited to any particular field, but can be applied to any field where an interface between a user and a computing device is applicable.

The disclosures of published PCT patent applications, PCT/US2017/023840 (WO2017165664), PCT/US2013/039687 (WO2013166489), and PCT/US2013/039696 (WO2013166490) are hereby incorporated by reference.

In alternative embodiments, example microwave suppression flap(s) can be rigid and non-flexible, but can be attached to top portion using hinges or any other articulating hardware as known in the art. Alternative hardware and flap fastening arrangements are also contemplated.

Unless otherwise defined, all technical and scientific terms used herein have the same meaning as commonly understood by one of ordinary skill in the art to which this invention belongs. Although methods and materials similar to or equivalent to those described herein can be used in the practice or testing of the present invention, suitable methods, and materials are described below. All publications, patent applications, patents, and other references mentioned herein are incorporated by reference in their entirety to the extent allowed by applicable law and regulations. In case of conflict, the present specification, including definitions, will control.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention. Those of ordinary skill in the art that have the disclosure before them will be able to make modifications and variations therein without departing from the scope of the invention.

The invention claimed is:

1. A system for processing material, comprising:
at least one microwave generator;
a first conveyor unit;
at least a first microwave guide operatively connecting the at least one microwave generator to the first conveyor unit;
the first conveyor unit provided in a first housing that comprises at least one opening configured to receive microwave energy via the first microwave guide; and
at least one microwave suppression tunnel comprising at least one flexible and/or movable microwave reflecting component within the tunnel, wherein the microwave reflecting component is a mesh flap configured to absorb, deflect, and/or block microwave energy, wherein the first conveyor unit is configured to receive and process a quantity of material, the system being configured to apply microwave energy to the material within the first housing at a first processing step, and wherein at least a portion of the at least one microwave reflecting component is configured to be deflected as the material passes through the tunnel and then to return to a resting, closed position when the material is no longer passing through the tunnel.

2. The system of claim 1, further comprising a second conveyor unit, the second conveyor unit provided in a second housing that comprises at least one opening configured to receive microwave energy via a second microwave guide, wherein the second conveyor unit is configured to receive the quantity of material, and is further configured to apply microwave energy to the material within the second housing at a second processing step.

3. The system of claim 1, wherein the flexible and/or movable microwave reflecting component comprises metallic shielding.

4. The system of claim 1, wherein the flexible and/or movable microwave reflecting component is coated with a protective material.

5. The system of claim 1, wherein the system is modular and portable.

6. The system of claim 1, wherein the tunnel is either:
a) an inlet microwave suppression tunnel associated with an inlet of the first conveyor unit, or
b) an outlet microwave suppression tunnel associated with an outlet of the first conveyor unit.

7. The system of claim 1, wherein the first processing step comprises heating the material.

8. The system of claim 7, wherein the first processing step comprises heating the material to a first temperature.

9. The system of claim 2, wherein the first processing step comprises heating the material to a first temperature, and wherein the material is heated to a second temperature at the second processing step.

10. The system of claim 9, wherein the second temperature is greater than the first temperature.

11. A method, comprising the steps of:
receiving a quantity of material at a first conveyor unit, wherein the material passes through at an inlet microwave suppression tunnel before entering the first conveyor unit;
transporting the quantity of material along the first conveyor unit causing microwaves emitted by at least one microwave generator operatively connected to a respective microwave guide to process the quantity of material within the first conveyor unit when the emitted microwaves are absorbed by at least a portion of the quantity of material at a first processing step within the first conveyor unit; and
causing the processed quantity of material to exit through an outlet microwave suppression tunnel, wherein at least one of the inlet or the outlet microwave suppression tunnel comprises at least one flexible and/or movable mesh flap within the respective inlet/outlet microwave suppression tunnel, wherein the at least one mesh flap is configured to absorb, deflect, and/or block microwave energy, and wherein at least a portion of the at least one mesh flap is configured to be deflected as the quantity of material passes through the respective inlet/outlet microwave suppression tunnel and then to return to a resting, closed position when the quantity of material is no longer passing through the respective inlet/outlet microwave suppression tunnel.

12. The method of claim 11, further comprising:
receiving the quantity of material at a second conveyor unit provided in a second housing; and
performing a second processing step to the quantity of material within the second conveyor unit using the at least one microwave generator coupled to the second housing of the second conveyor unit.

13. The method of claim 11, wherein a processing speed of at least one conveyor unit is adjusted.

14. The method of claim 11, wherein the first processing step comprises heating the material.

15. The method of claim 11, wherein the first conveyor unit comprises an auger, and wherein the quantity of material is transported along the first conveyor unit by causing the auger to rotate.

16. The method of claim 11, wherein both the inlet microwave and the outlet microwave suppression tunnel each comprise at least one flexible and/or movable mesh flap within the respective inlet/outlet microwave suppression tunnel,
wherein the at least one inlet/outlet mesh flap is configured to absorb, deflect, and/or block microwave energy, and
wherein the at least one inlet/outlet mesh flap is configured to be deflected as the quantity of material passes through the respective inlet/outlet microwave suppression tunnel and then to return to a resting, closed position when the quantity of material is no longer passing through the respective inlet/outlet microwave suppression tunnel.

17. The method of claim 14, wherein the first processing step comprises heating the material to a first temperature.

18. The method of claim 12, wherein the first processing step comprises heating the material to a first temperature, and wherein the material is heated to a second temperature at the second processing step.

19. The method of claim 18, wherein the second temperature is greater than the first temperature.

20. The method of claim 18, wherein at least one of the first temperature and the second temperature is a target temperature according to a specification.

* * * * *